(12) United States Patent
Noda et al.

(10) Patent No.: US 7,001,812 B2
(45) Date of Patent: Feb. 21, 2006

(54) METHOD OF MANUFACTURING SEMI CONDUCTOR DEVICE

(75) Inventors: Takafumi Noda, Shiojiri (JP); Susumu Inoue, Sakata (JP); Masahiko Tsuyuki, Chino (JP); Akihiko Ebina, Fiujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/961,768

(22) Filed: Oct. 7, 2004

(65) Prior Publication Data

US 2005/0130365 A1    Jun. 16, 2005

(30) Foreign Application Priority Data

Oct. 10, 2003    (JP) .............................. 2003-352709

(51) Int. Cl.
*H01L 21/8234*    (2006.01)

(52) U.S. Cl. ...................... 438/275; 438/216; 438/258; 438/261; 438/266; 438/287

(58) Field of Classification Search ................ 438/216, 438/258, 261, 266, 275, 287
See application file for complete search history.

(56) References Cited

U.S. PATENT DOCUMENTS

| | | | |
|---|---|---|---|
| 5,908,311 A * | 6/1999 | Chi et al. | 438/258 |
| 6,448,137 B1 * | 9/2002 | Lai et al. | 438/258 |
| 6,677,200 B1 * | 1/2004 | Lee et al. | 438/257 |
| 6,750,525 B1 * | 6/2004 | Yim et al. | 257/500 |

* cited by examiner

*Primary Examiner*—Christian D. Wilson
*Assistant Examiner*—Douglas Menz
(74) *Attorney, Agent, or Firm*—John J. Penny, Jr.; Edwards Angell Palmer & Dodge LLP

(57)    ABSTRACT

A fabrication method of a semiconductor device which has on the same semiconductor layer a transistor with a different high voltage gate as well as a high voltage drain and an MNOS memory transistor.

12 Claims, 21 Drawing Sheets

METHOD OF MANUFACTURING SEMI CONDUCTOR DEVICE

The present invention claim priority from Japanese Application No. 2003-352709 filed on Oct. 10, 2003, which is hereby incorporated by reference in its entirety.

BACKGROUND OF THE INVENTION

1. Field of the Invention

The present invention relates to a fabrication method of a semiconductor device, and particularly to a semiconductor device having transistors with different high voltage gates as well as high voltage drains and an MNOS memory transistor within the same semiconductor layer.

2. Related Art

In the fabrication process of a high voltage transistor, by comparison to a low voltage drive transistor, a high temperature process for forming a deep well and a thick gate insulating layer are necessary. This high temperature process is unique to a forming process of the high voltage drive transistor, and, typically, the high voltage transistor for high voltage operation and the low voltage drive transistor were individually formed.

On the other hand, research and development on the so-called SOC (System On Chip) has been conducted in recent years to combine a plurality of ICs on one piece of IC chip.

SUMMARY OF THE INVENTION

It is an object of the present invention to provide a fabrication method of a semiconductor device which has on the same semiconductor layer a transistor with a different high voltage gate as well as a high voltage drain and an MNOS memory transistor.

A fabrication method of a semiconductor device according to one embodiment of the present invention is a fabrication method of a semiconductor device which has a high voltage transistor, a low voltage drive transistor, and an MNOS memory transistor comprising: a step of: forming a first mask layer above a high voltage transistor forming area wherein the high voltage transistor is formed, a low voltage drive transistor area wherein the low voltage drive transistor is formed, and an MNOS memory transistor forming area wherein the MNOS memory transistor is formed, each forming area being of the semiconductor layer; a step of forming a second mask layer above the first mask layer; a step of removing the first mask layer and the second mask layer formed on a first gate insulating layer of the high voltage transistor; a step of forming a first gate insulating layer by a thermal oxidation process on the high voltage transistor forming area using the first mask layer and the second mask layer as a mask; a step of removing the second mask layer formed on the high voltage transistor forming area, the low voltage drive transistor forming area, and the MNOS memory transistor forming area; a step of removing the first mask layer formed on the MNOS memory transistor forming area; a step of forming a multi-layered film wherein at least a silicon oxide layer and a silicon nitride layer are stacked above the high voltage transistor forming area, the low voltage drive transistor forming area, and the MNOS memory transistor forming area, each forming area being of the semiconductor layer; a step of removing the multi-layered film formed on the low voltage drive transistor forming area; a step of removing the first mask layer formed on the low voltage drive transistor forming area; a step of forming a second gate insulating layer on the low voltage drive transistor forming area; a step of forming a gate electrode on the high voltage transistor forming area, the low voltage drive transistor forming area, and the MNOS memory transistor forming area; and a step of forming a source/drain area on the high voltage transistor forming area, the low voltage drive transistor forming area, and the MNOS memory transistor forming area.

In the fabrication method of the semiconductor device according to one embodiment of the present invention, the MNOS (Metal Nitride Oxide Semiconductor) memory transistor includes a MONOS (Metal Oxide Nitride Oxide Semiconductor) memory transistor. Namely, the multi-layered film is stacked with at least a silicon oxide layer and a silicon nitride layer, and may consist of, for example, a first silicon oxide layer, a silicon nitride layer, and a second silicon nitride layer.

In the fabrication method of the semiconductor device according to the present invention, forming above a specified layer (hereinafter referred to as "A layer") another specified layer (hereinafter referred to as "B layer") includes a case where the B layer is directly formed on the A layer and a case where the B layer is formed through another layer above the A layer. Also, a "source/drain area" means a source area or a drain area.

According to this fabrication method, it is possible to form together with the low voltage drive transistor, the high voltage transistor requiring a high temperature process for forming a deep well and the thick gate insulating layer, and the MNOS memory transistor requiring its unique multi-layered film formation process.

In the fabrication method of the semiconductor device according to the present invention, the step of removing the multi-layered film formed on the low voltage drive transistor forming area may not remove the multi-layered film formed at least above a channel area of the high voltage transistor.

In the fabrication method of the semiconductor device according to the present invention, the multi-layered film may be formed such that the first silicon oxide layer, the silicon nitride layer, and the second silicon oxide layer may be layered over.

In the fabrication method of the semiconductor device according to the present invention, there may be included a step of forming the well by ion implantation on the low voltage drive transistor forming area and the MNOS memory transistor forming area, wherein the ion implantation may be performed through the first mask layer.

In the fabrication method of the semiconductor device according to the present invention, there may be included a step of forming an element isolation area by trench element isolation on the high voltage transistor forming area by a LOCOS method, and a step of forming an element isolation area in the low voltage drive transistor forming area and the MNOS memory transistor forming area.

In the fabrication method of the semiconductor device according to the present invention, the LOCOS method includes a recessed LOCOS method and a semi-recessed LOCOS method.

In the fabrication method of the semiconductor device according to the present invention, the well in the low voltage drive transistor forming area and the MNOS memory transistor forming area may be formed prior to the step of forming the element isolation area in the low voltage drive transistor forming area and the MNOS memory transistor forming area.

In the fabrication method of a semiconductor device according to the present invention, the well in the low voltage drive transistor forming area and the MNOS memory transistor forming area may be formed subsequent to the step of forming the element isolation area in the low voltage drive transistor forming area and the MNOS memory transistor forming area.

In the fabrication method of a semiconductor device according to the present invention, the high voltage transistor may be formed such as to have an offset insulating layer.

In the fabrication method of a semiconductor device according to the present invention, the offset insulating layer may be formed by the LOCOS method.

DESCRIPTION OF THE PREFERRED EMBODIMENTS

Preferred embodiments of the present invention will be described with reference to the accompanying drawings.

1. Semiconductor Device

Figure 1:
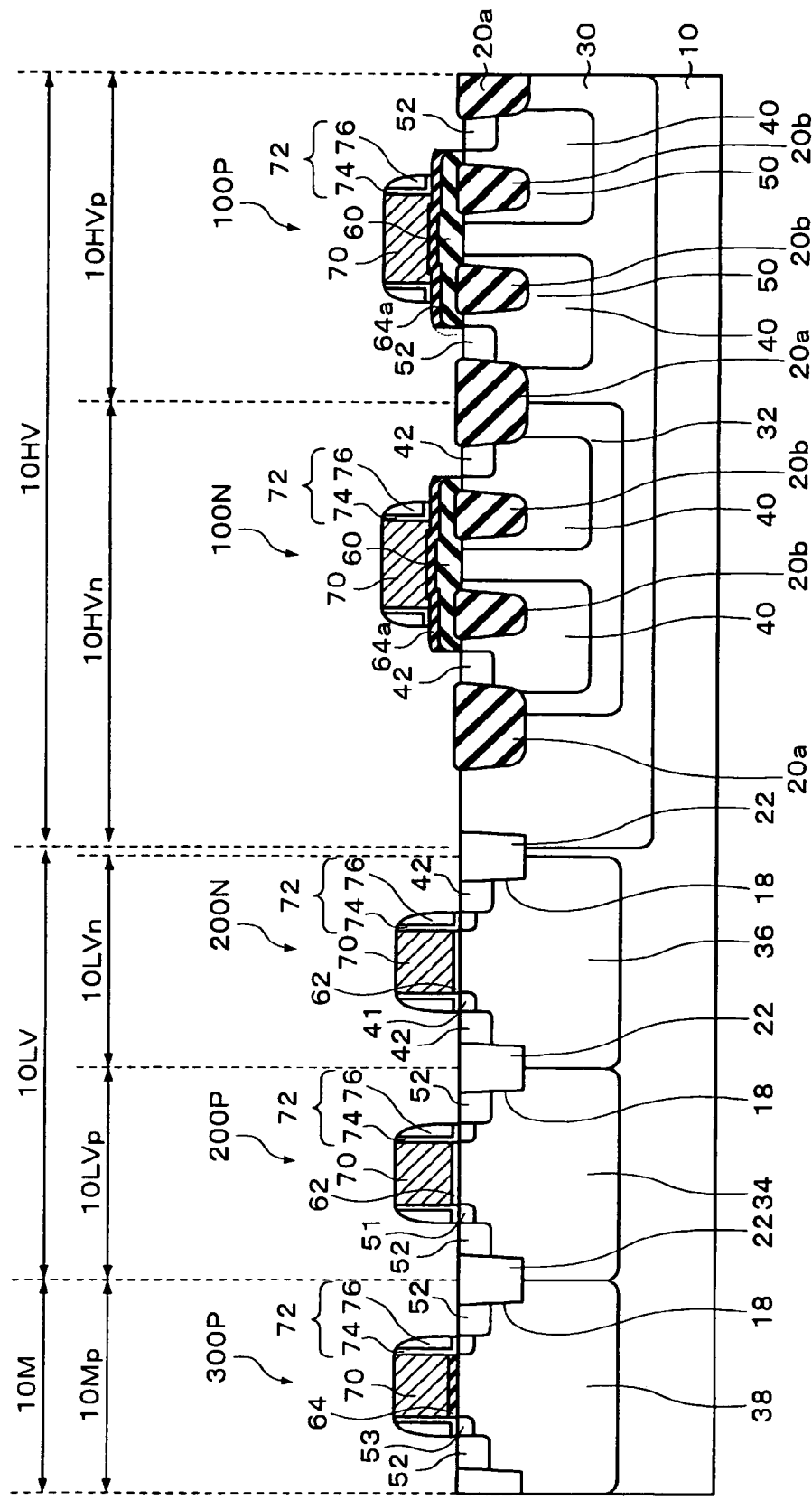
FIG. 1 is a sectional view of a fabrication method of a semiconductor device according to the present embodiment.

First, a semiconductor device fabricated by a fabrication method according to one embodiment of the present embodiment will be described. FIG. 1 is a schematic sectional view of a semiconductor device fabricated by a fabrication method according to one embodiment of the present embodiment.

The semiconductor device has a semiconductor layer 10. In the semiconductor device, there are provided a high voltage transistor forming area 10HV, a low voltage drive transistor forming area 10LV, and a MONOS memory transistor forming area (hereinafter referred to as "MONOS forming area") 10M. The high voltage transistor forming area 10HV has an n-type high transistor forming area 10HVn and a p-type low voltage drive transistor forming area 10HVp. The low voltage drive transistor forming area 10LV has an n-type low drive transistor forming area 10LVn and a p-type low voltage drive transistor forming area 10LVp. The MONOS forming area 10M has a p-type MONOS memory transistor forming area (hereinafter referred to as "p-type MONOS forming area") 10Mp.

On the n-type high transistor forming area 10HVn, there is formed an n-type high transistor 100N, while on the p-type high voltage transistor forming area 10HVp, there is formed a p-type high voltage transistor 100P. Likewise, on the n-type low drive transistor forming area 10LVn, there is formed an n-type low drive transistor 200N, while on the p-type low voltage drive transistor forming area 10LVp, there is formed a p-type low voltage drive transistor 200P. On the p-type MONOS forming area 10Mp, there is formed a p-type MONOS memory transistor 300P.

Namely, on the identical substrate (the identical chip), there are mounted together the n-type high voltage transistor 100N, the p-type high voltage transistor 100P, the n-type low drive transistor 200N, the p-type low voltage drive transistor 200P, and the p-type MONOS memory transistor 300P. It should be noted that although only five transistors are illustrated in FIG. 1, this is merely for the sake of convenience. Needless to say, a plurality of each transistor may be formed on the identical substrate. For example, on the MONOS forming area 10M, there may be formed an n-type MONOS memory transistor.

1. 1 The High Voltage Transistor Forming Area 10HV

First, the high voltage transistor forming area 10HV will be described. On the high voltage transistor forming area 10HV, there are formed the n-type high voltage transistor 100N and the p-type high voltage transistor 100P. Between the n-type high voltage transistor 100N and the adjacent p-type high voltage transistor 100P, there is provided a first element isolation area 110. The first element isolation area 110 consists of a semi-recessed LOCOS layer.

Next, the configuration of the n-type high voltage transistor 100N and the p-type high voltage transistor 100P will be described.

The n-type high voltage transistor 100N includes a first gate insulating layer 60, an offset insulating layer 20 made up of the semi-recessed LOCOS layer, a multi-layered film 64a, a gate electrode 70, an n-type offset area 40, a sidewall insulating layer 72, and an n-type source/drain area 42.

The first gate insulating layer 60 is provided at least on a channel area inside a p-type well 32. The p-type well 32 is formed inside an n-type first well 30. An offset insulting layer 20b is provided inside the n-type offset area 40 on both ends of the first insulating layer 60. The multi-layered film 64a is formed at least on the channel area. The gate electrode 70 is formed on the multi-layered film 64a. The n-type offset area 40 is formed inside the p-type first well 32. The sidewall insulating layer 72 is formed on the sidewall of the gate electrode 70. The sidewall insulating layer 72 has, for example, a silicon oxide layer 74 having an L sectional shape and a silicon nitride layer 76 formed above the silicon oxide layer 74. The n-type source/drain area 42 is provided inside the semiconductor layer 10 which is outside the sidewall insulating layer 72.

The p-type high voltage transistor 100P has the first gate insulating layer 60, the offset insulating layer 20b consisting of the semi-recessed LOCOS layer, the multi-layered film 64a, the gate electrode 70, the p-type offset area 50, the sidewall insulating layer 72, and a p-type source/drain area 52.

The first gate insulating layer 60 is provided at least on the channel area inside the n-type first well 30. The offset insulting layer 20b is provided inside the p-type offset area 50 on both ends of the first insulating layer 60. The multi-layered film 64a is formed at least on the channel area. The gate electrode 70 is formed on the multi-layered film 64a. The p-type offset area 50 is formed inside the n-type first well 30. The sidewall insulating layer 72 is formed on the sidewall of the gate electrode 70. The sidewall insulating layer 72 has, for example, a silicon oxide layer 74 having an L sectional shape and a silicon nitride layer 76 formed on the silicon oxide layer 74. The n-type source/drain area 42 is provided inside the semiconductor layer 10, which is outside the sidewall insulating layer 72.

1. 2 The Low Voltage Drive Transistor Forming Area 10LV

Next, the low voltage drive transistor forming area 10LV will be described. On the low voltage drive transistor forming area 10LV, there are formed the n-type low voltage drive transistor 200N and the p-type low voltage drive transistor 200P. Between the n-type low voltage drive transistor 200N and the adjacent p-type low voltage drive transistor 200P, there is provided a second element isolation area 210.

Next, configuration of each transistor will be described.

The n-type low voltage drive transistor 200N includes a second gate insulating layer 62, the gate electrode 70, the sidewall insulating layer 72, an n-type extension area 41, and the n-type source/drain area 42.

The second gate insulating layer 62 is provided at least on the channel area inside the p-type second well 36. The gate electrode 70 is formed on the second gate insulating layer 62. The sidewall insulating layer 72 is formed on a sidewall of the gate electrode 70. The sidewall insulating layer 72 has, for example, the silicon oxide layer 74 having an L sectional shape and the silicon nitride layer 76 formed on the silicon oxide layer 74. The n-type extension area 41 is formed inside the p-type second well 36. The n-type source/drain area 42 is provided inside the semiconductor layer 10 which is outside the sidewall insulating layer 72.

The p-type low voltage drive transistor 200P has the second gate insulating layer 62, the gate electrode 70, the sidewall insulating layer 72, a p-type extension area 51, and the p-type source/drain area 52.

The second gate insulating layer 62 is provided at least on the channel area inside the n-type second well 34. The gate electrode 70 is formed on the second gate insulating layer 62. The sidewall insulating layer 72 is formed on the sidewall of the gate electrode 70. The sidewall insulating layer 72 has, for example, the silicon oxide layer 74 having an L sectional shape and the silicon nitride layer 76 formed above the silicon oxide layer 74. The p-type extension area 51 is formed inside the n-type second well 34. A p-type source/drain area 52 is provided inside the semiconductor layer 10 which is outside the sidewall insulating layer 72.

1. 3 The MONOS Forming Area 10M

Next, the MONOS forming area 10M will be described. On the MONOS forming area 10M, there is formed the p-type MONOS memory transistor 300P. The p-type MONOS memory transistor 300P has a third gate insulating layer 64, the gate electrode 70, the sidewall insulating layer 72, the p-type extension area 51, and the p-type source/drain area 52.

The third gate insulating layer 64 is a multi-layered film wherein the first silicon oxide layer, the silicon nitride layer, and the second silicon oxide layer are stacked. By means of generating a high electric field in the first silicon oxide layer through a voltage impressed on the third gate insulating layer 64, and making an electron, due to the direct tunnel effect, to come and go between the semiconductor layer and a first silicon oxide layer-silicon nitride layer interface, there is altered a threshold voltage to perform a write/erase operation. Since there is an electron capture level on the first silicon oxide layer-silicon nitride layer interface, information is stored and held by capturing the electron herein.

The third gate insulating layer 64 is provided at least on the channel area inside the n-type third well 38. The gate electrode 70 is formed on the third gate insulating layer 64. The sidewall insulating layer 72 is formed on the sidewall of the gate electrode 70. The sidewall insulating layer 72 has, for example, the silicon oxide layer 74 having an L sectional shape and the silicon nitride layer 76 formed on the silicon oxide layer 74. The p-type extension area 51 is formed inside the n-type third well 38. The p-type source/drain area 52 is provided inside the semiconductor layer 10 which is outside the sidewall insulating layer 72.

2. Fabrication Method of the Semiconductor Device

Next, the fabrication method of the semiconductor device according to the present embodiment will be described with reference to FIGS. 1 to 18. FIGS. 1 to 18 are sectional views schematically showing the process of the fabrication method of the semiconductor device according to the present embodiment.

Figure 2:
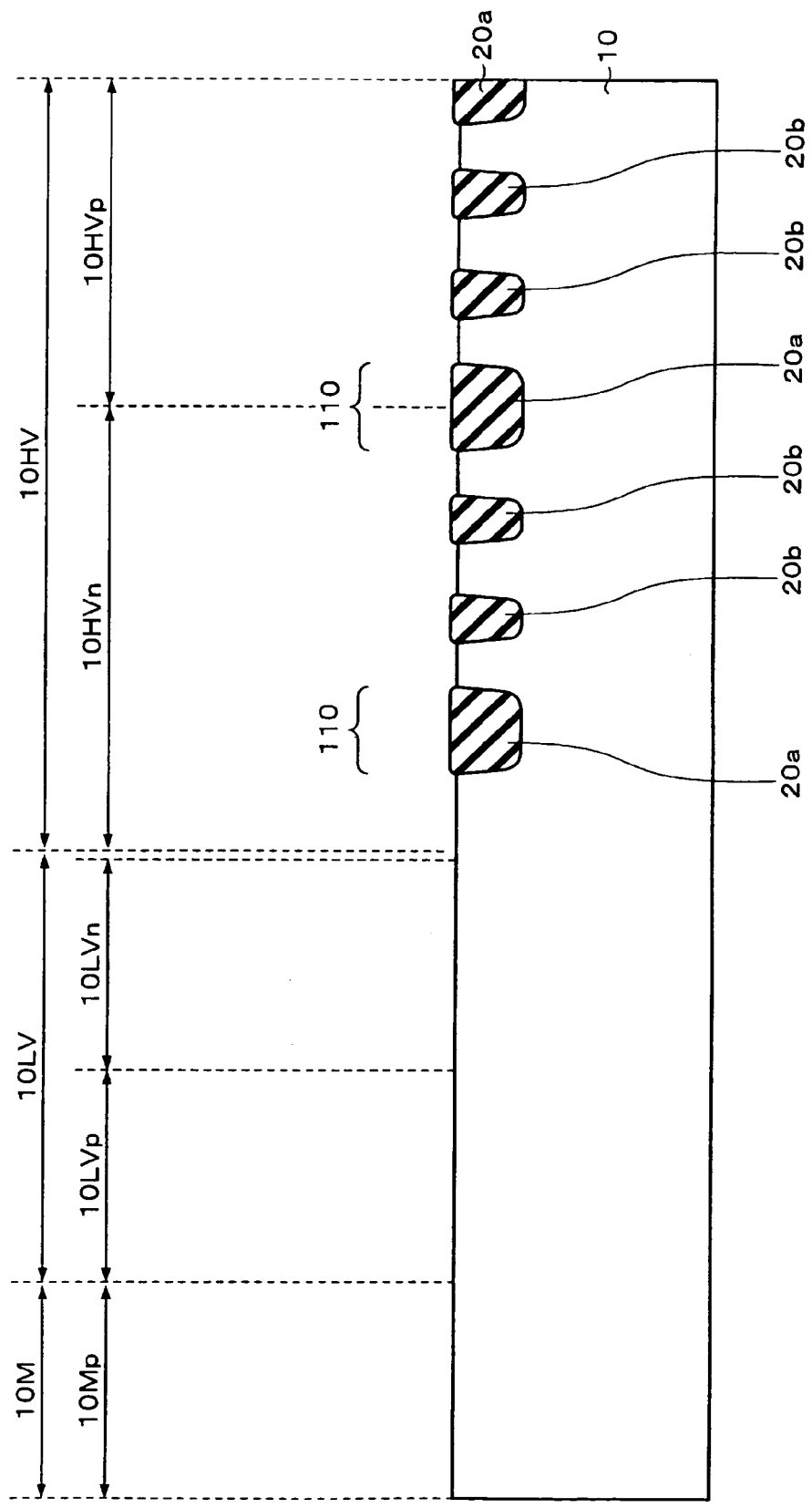
FIG. 2 is a sectional view of a fabrication method of a semiconductor device according to the present embodiment.

(1) First, as shown in FIG. 2, on the high voltage transistor forming area 10HV, there are formed a semi-recessed LOCOS layer 20a performing a role of element isolation and an offset insulating layer 20b for relaxation of the electric field. An example of a method of forming the semi-recessed LOCOS layer 20a and the offset insulating layer 20b will be described below.

Now, a silicon oxide nitride layer is formed by the CVD method on the semiconductor layer 10. The semiconductor layer 10 includes at least silicon and is composed of silicon, silicon germanium and the like. The semiconductor layer 10 may be a silicon layer on a silicon substrate in bulk or an SOI (Silicon On Insulator) substrate. Thickness of the silicon oxide nitride layer is, for example, 8 to 12 nm. Next, a silicon nitride layer is formed by the CVD method on the silicon oxide nitride layer. Then, on the silicon nitride layer, there is formed a photoresist layer having an opening on a area wherein the semi-recessed LOCOS layer 20a and the offset insulating layer 20b are formed. Subsequently, using this photoresist layer as a mask, a concavity is formed by etching the silicon nitride layer, the silicon oxide nitride layer and the semiconductor layer 10 on the area wherein the semi-recessed LOCOS layer 20a and the offset insulating layer 20b are formed. This is followed by removal of the photoresist layer.

Figure 3:
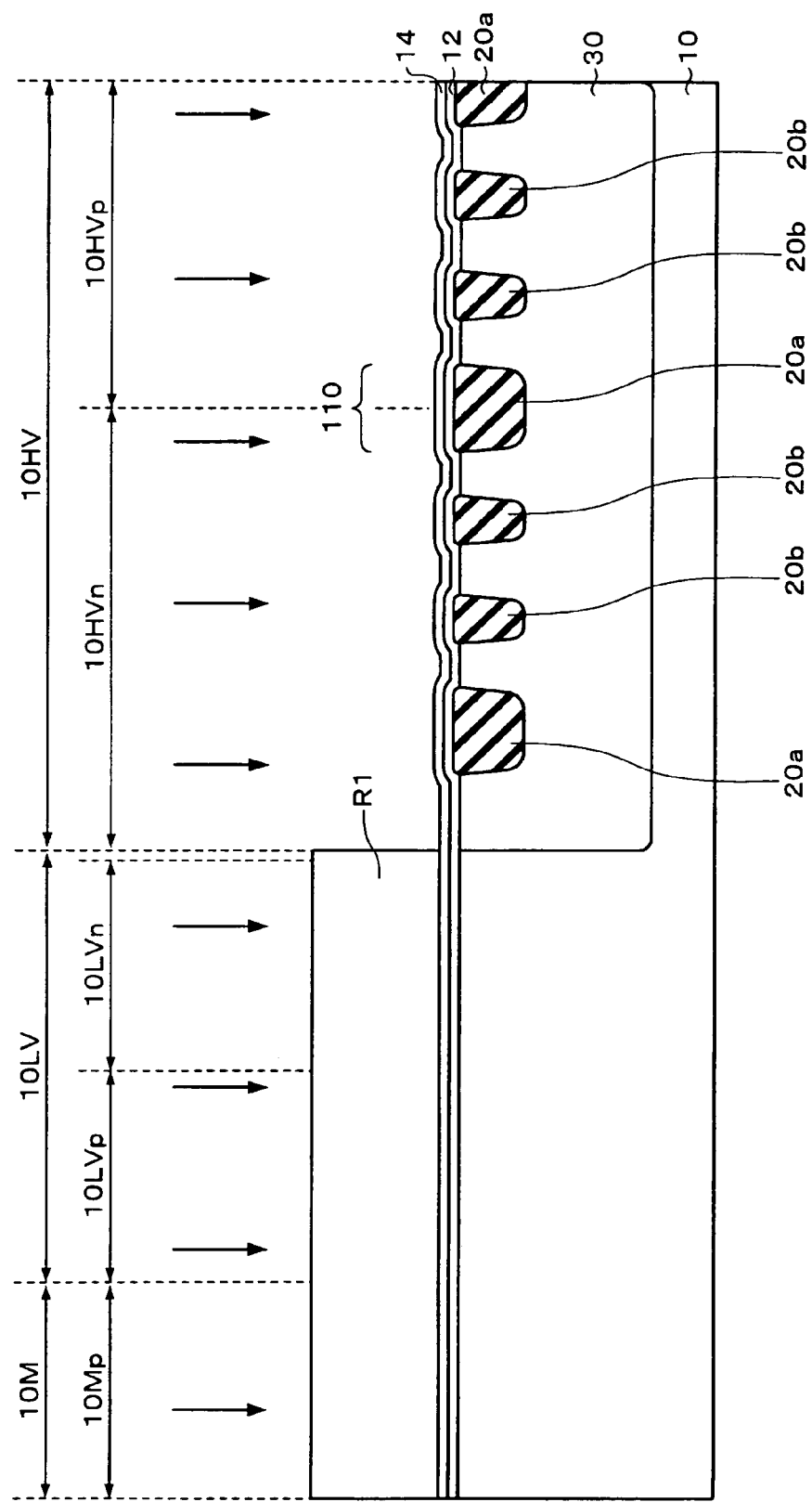
FIG. 3 is a sectional view of a fabrication method of a semiconductor device according to the present embodiment.

Next, by forming a silicon oxide layer through the thermal oxidation process on an exposed surface of the semiconductor layer 10, as shown in FIG. 3, there is formed the semi-recessed LOCOS layer 20a as a first element isolation area 110 to confirm the high voltage transistor forming area 10HV, and the high voltage transistors 100P and N of the offset insulating layers 20b.

(2) Next, as shown in FIG. 3, formation of the n-type first well 30 is carried out on the high voltage transistor forming area 10HV. First, a sacrificial oxide layer 12 is formed over the entire surface of the semiconductor layer 10. As the sacrificial oxide layer 12, for example, a silicon oxide layer is formed. Next, on the sacrificial oxide layer 12, there is formed a stopper layer 14. As the stopper layer 14, for example, silicon nitride may be used. The stopper layer 14 may be formed, for example, by the CVD method.

Then, a photoresist layer R1 having a prescribed pattern is formed, and using this photoresist layer R1 as a mask, n-type impurities such as phosphor and arsenic are implanted one time or a plurality of times into the semiconductor layer 10, after the photoresist layer R1 is removed, for example, by ashing. Thereafter, heat treatment is conducted to diffuse the impurities layer, thus forming the n-type first well 30 inside the semiconductor 10.

Figure 4:
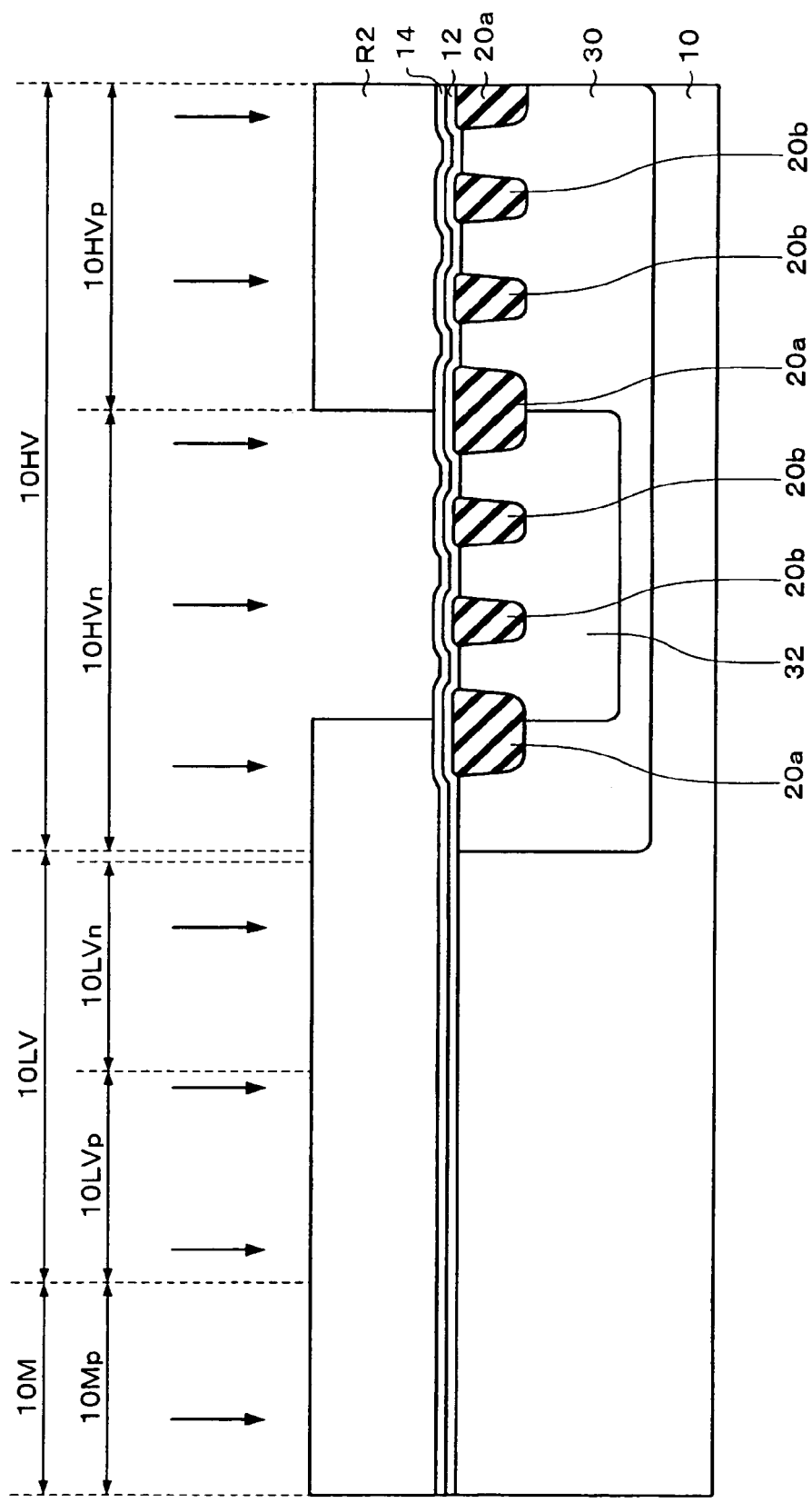
FIG. 4 is a sectional view of a fabrication method of a semiconductor device according to the present embodiment.

(3) Next, as shown in FIG. 4, the p-type first well 32 is formed on the high voltage transistor area 10HV. First, a photoresist layer R2 having a prescribed pattern is formed, and using this photoresist layer R2 as a mask, a p-type impurity ion is implanted one time or a plurality of times into the semiconductor layer 10, after the photoresist layer R2 is removed, for example, by ashing. Thereafter, heat treatment is conducted to diffuse impurities layer, thus forming the p-type first well 32. This is followed by removing the photoresist layer R2, for example, by ashing.

Figure 5:
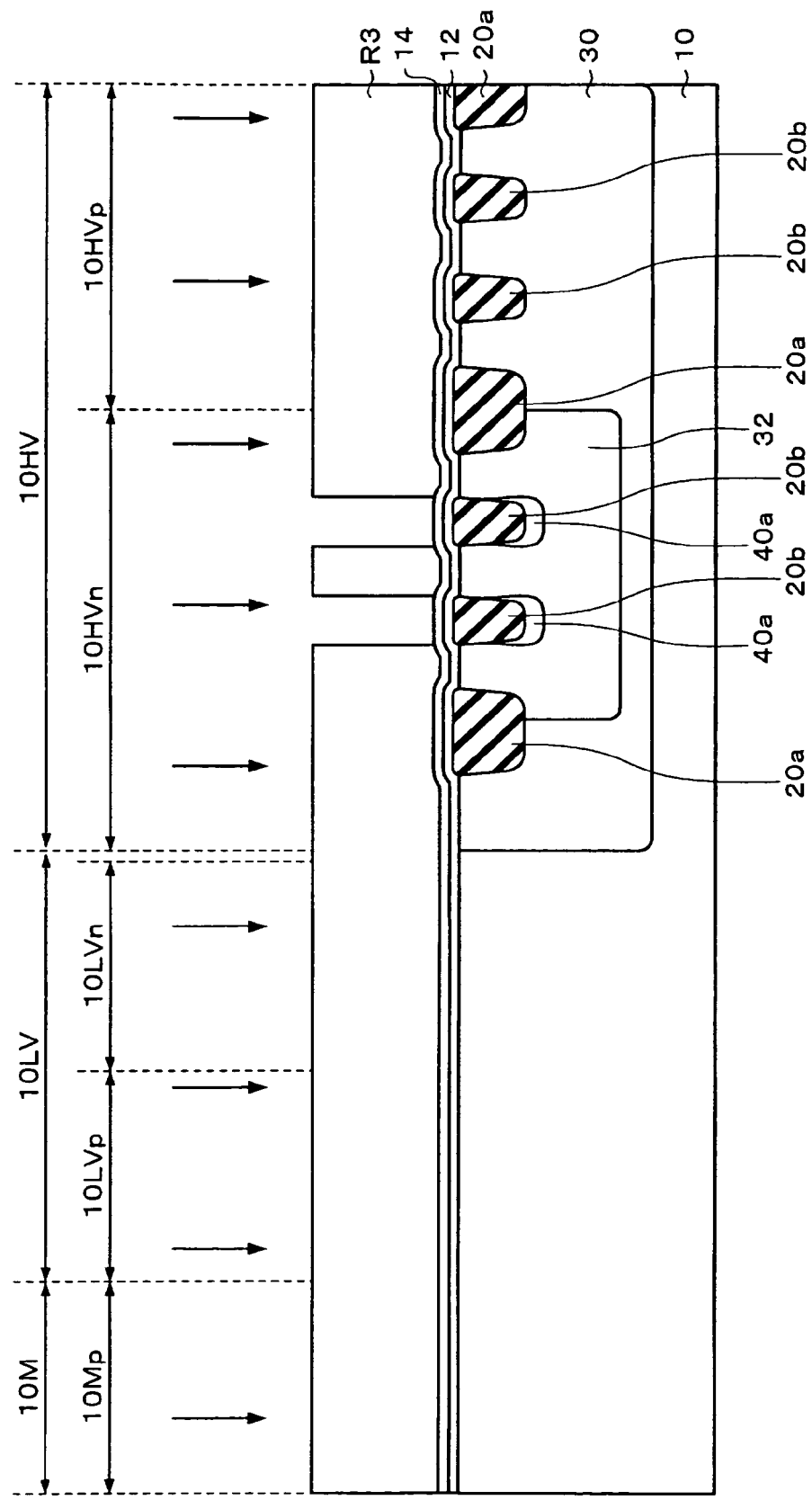
FIG. 5 is a sectional view of a fabrication method of a semiconductor device according to the present embodiment.

(4) Next, as shown in FIG. 5, an impurities layer 40a for the offset area is formed on the n-type high voltage transistor area 10HVn. First, a photoresist layer R3 having a prescribed pattern is formed, and using this photoresist layer R3 as a mask, the impurities layer 40a is formed by introducing n-type impurities into the semiconductor layer 10, whereafter the photoresist layer R3 is removed.

Figure 6:
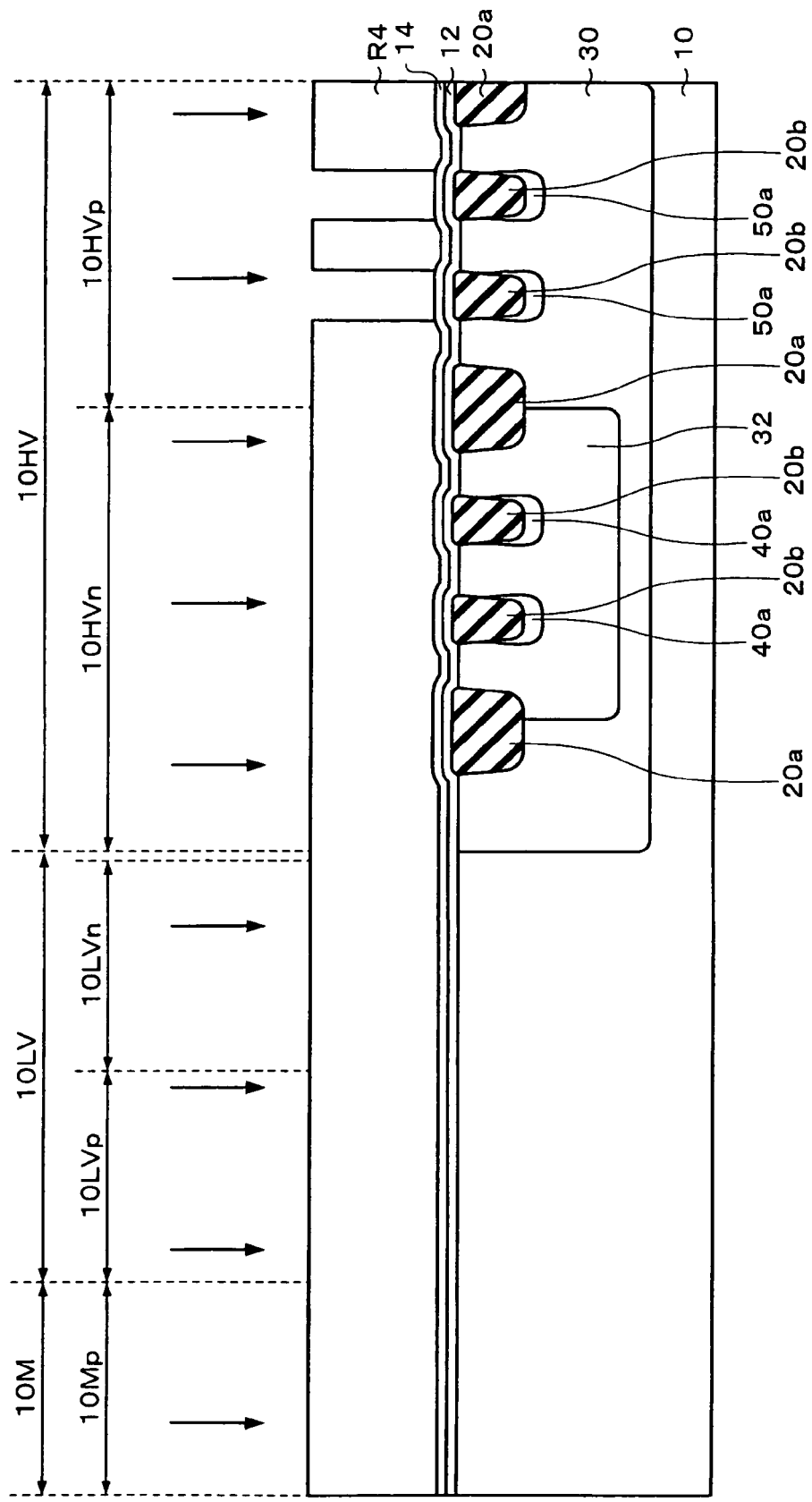
FIG. 6 is a sectional view of a fabrication method of a semiconductor device according to the present embodiment.

(5) Next, as shown in FIG. 6, an impurities layer 50a for the offset area is formed on the p-type high voltage transistor area 10HVp. First, a photoresist layer R4 covering a prescribed area is formed, and using this photoresist layer R4 as a mask, the impurities layer 50a is formed by introducing p-type impurities into the semiconductor layer 10, whereafter the photoresist layer R4 is removed. It should be noted that a sequence of steps (4) and (5) may be carried out in a reverse sequence to the present embodiment.

Figure 7:
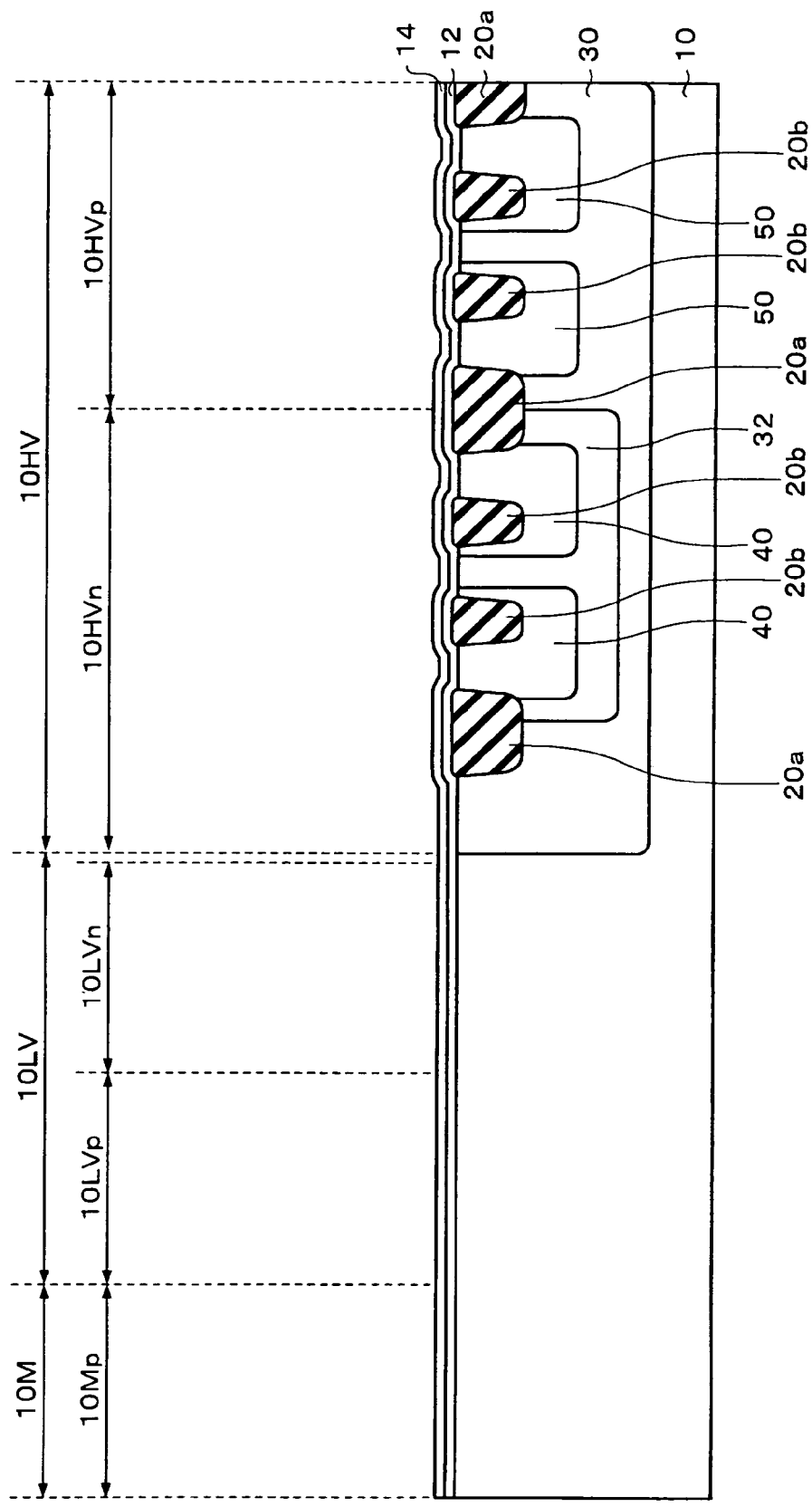
FIG. 7 is a sectional view of a fabrication method of a semiconductor device according to the present embodiment.

(6) Next, as shown in FIG. 7, the impurities layers 40a and 50a are diffused by carrying out heat treatment using publicly known technology, and the offset areas 40 and 50 of the high voltage transistors 100P and N are formed.

Figure 9:
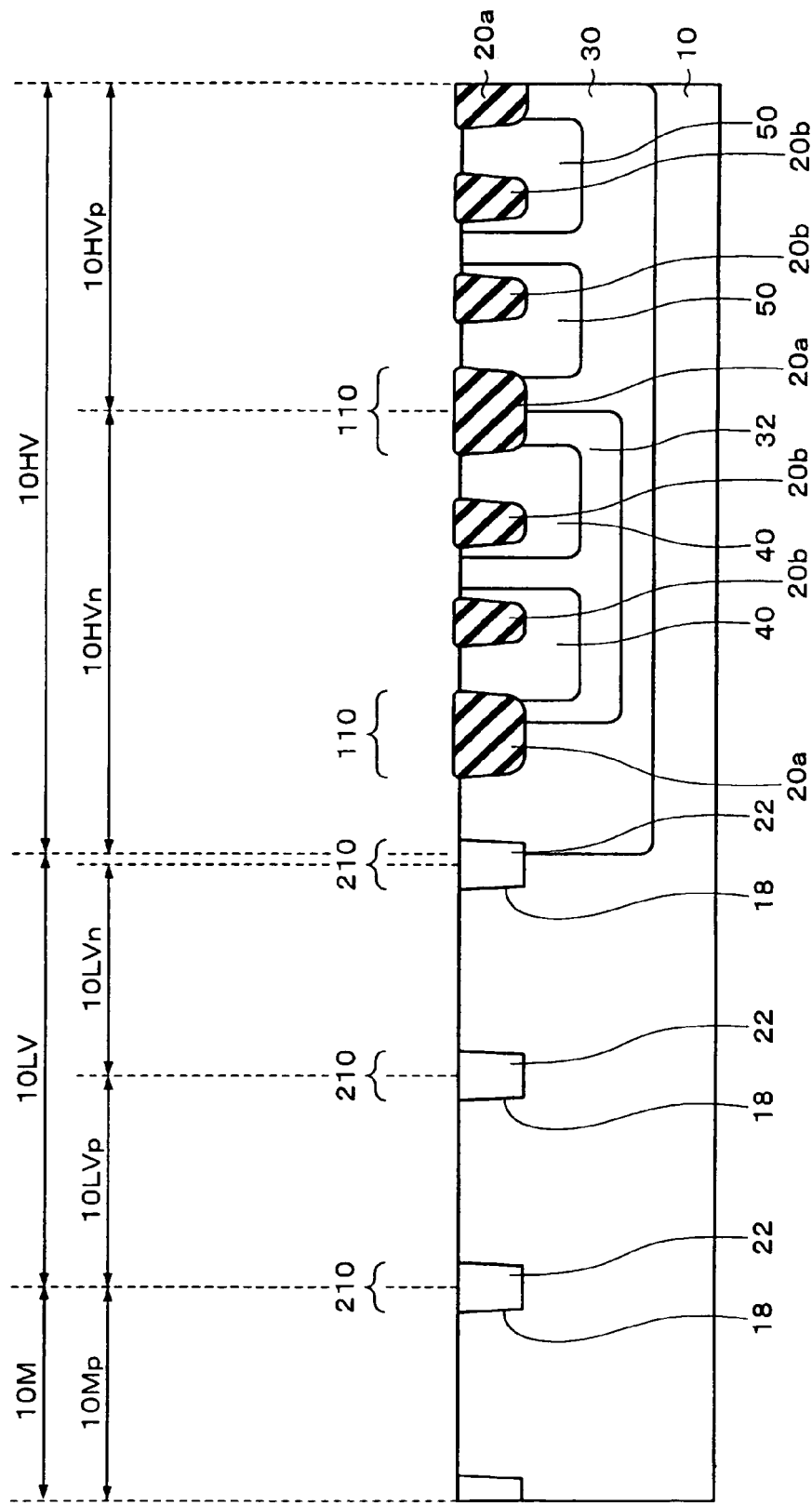
FIG. 9 is a sectional view of a fabrication method of a semiconductor device according to the present embodiment.

(7) Next, a trench insulating layer 22 is formed on the low voltage drive transistor forming area 10LV and the MONOS forming area 10M, and formation of the second element isolation area 210 is carried out (refer to FIG. 9).

Figure 8:
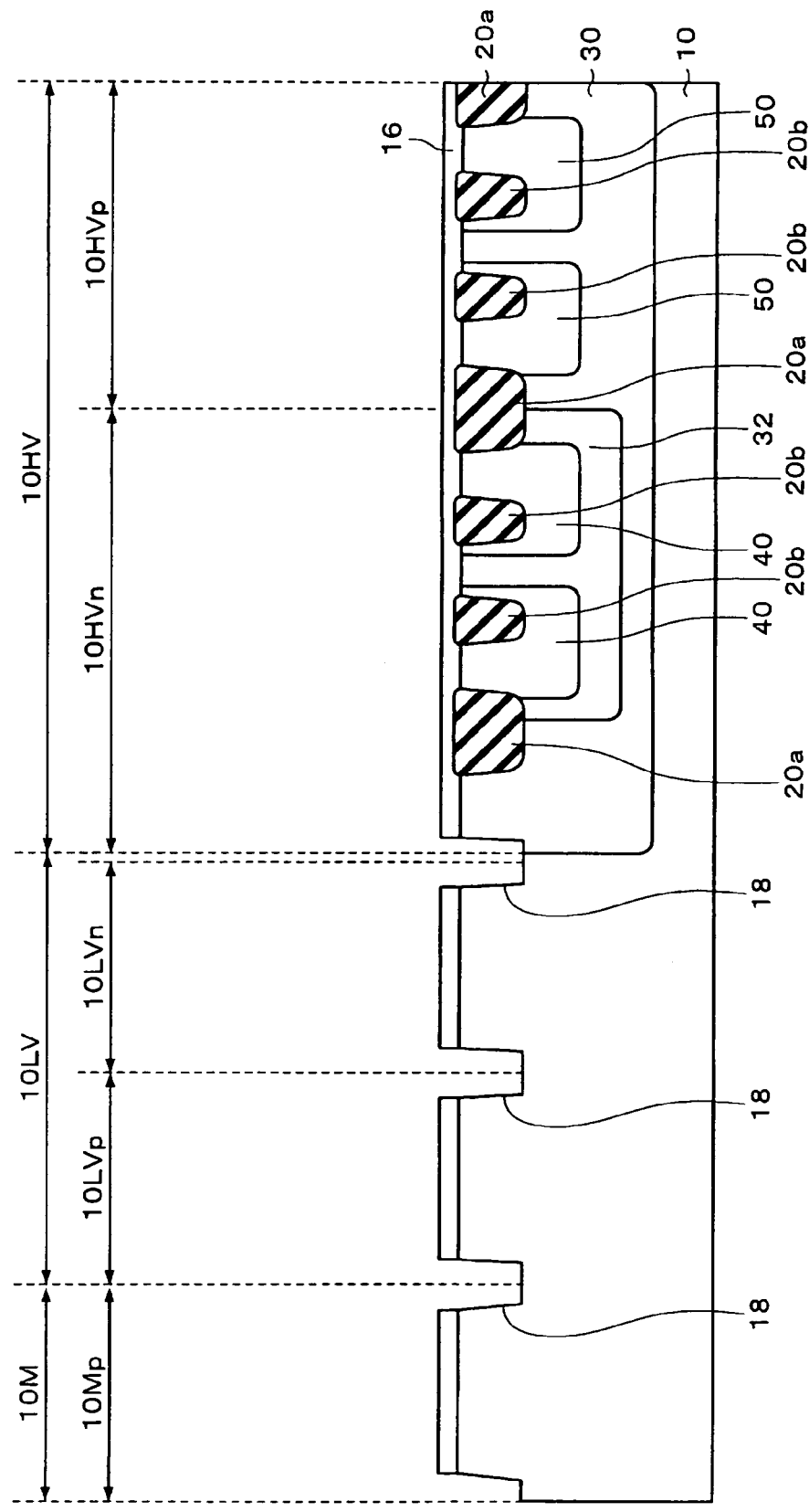
FIG. 8 is a sectional view of a fabrication method of a semiconductor device according to the present embodiment.

First, as shown in FIG. 8, a stopper layer 16 is formed over the entire surface of the semiconductor layer 10. For the stopper layer 16, for example, a multi-layered film of the silicon oxide nitride layer and the silicon nitride layer formed thereon may be used. The stopper layer 16 may be, for example, formed by the CVD method and the like. Next, on the stopper layer 16, there is formed a mask layer (not shown) having an opening on an area on which the second element isolation area 210 is formed. As shown in FIG. 8, with this mask layer as a mask, the stopper layer 16 and the semiconductor layer 10 are subjected to etching by publicly known etching techniques. This causes a trench 18 to be formed.

(8) Next, a trench oxide film (not shown in FIG. 9) is formed on a surface of the trench 18. The forming method of the trench oxide film is, for example, carried out by the thermal oxidation process. Film thickness of the trench oxide film is, for example, 50 to 500 nm.

Next, an insulating layer (not shown) is deposited over the entire surface as if embedding the trench 18. The deposited insulating layer is, for example, after being ground until the stopper 16 is exposed by CMP treated such that the trench insulating layer 22 may be formed thereon by removing the stopper 16 through etching until the surface of the semiconductor layer 10 is exposed.

Figure 10:
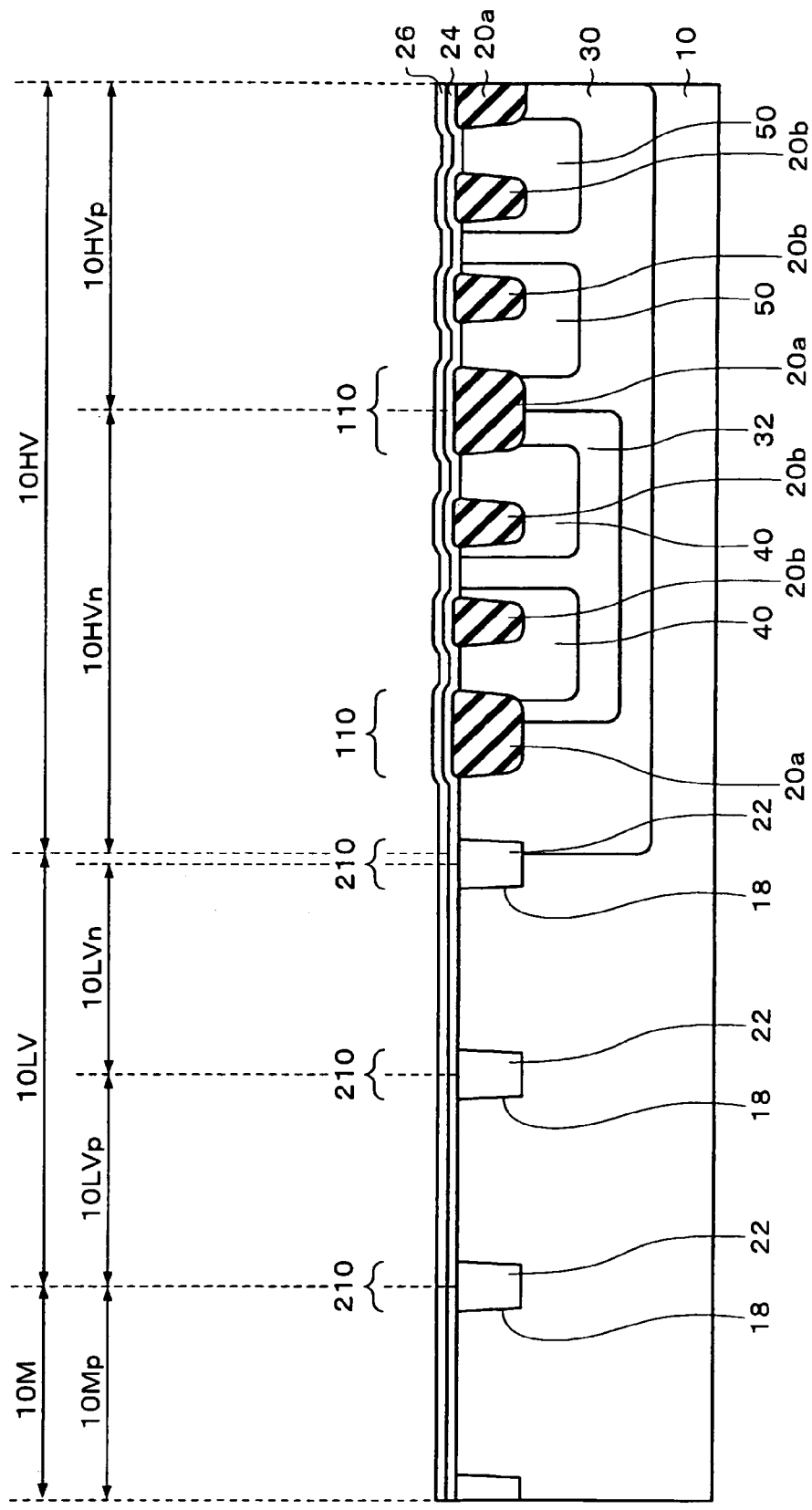
FIG. 10 is a sectional view of a fabrication method of a semiconductor device according to the present embodiment.

(9) Next, as shown in FIG. 10, the first mask layer 24 and the second mask layer 26 are formed over the entire surface of the semiconductor layer 10. As the first mask layer 24, for example, silicon oxide may be used. As the second mask layer 26, for example, silicon nitride may be used. The first mask layer 24, for example, may be formed by the thermal oxidation process. The second mask layer 26, for example, may be formed by the CVD method.

Figure 11:
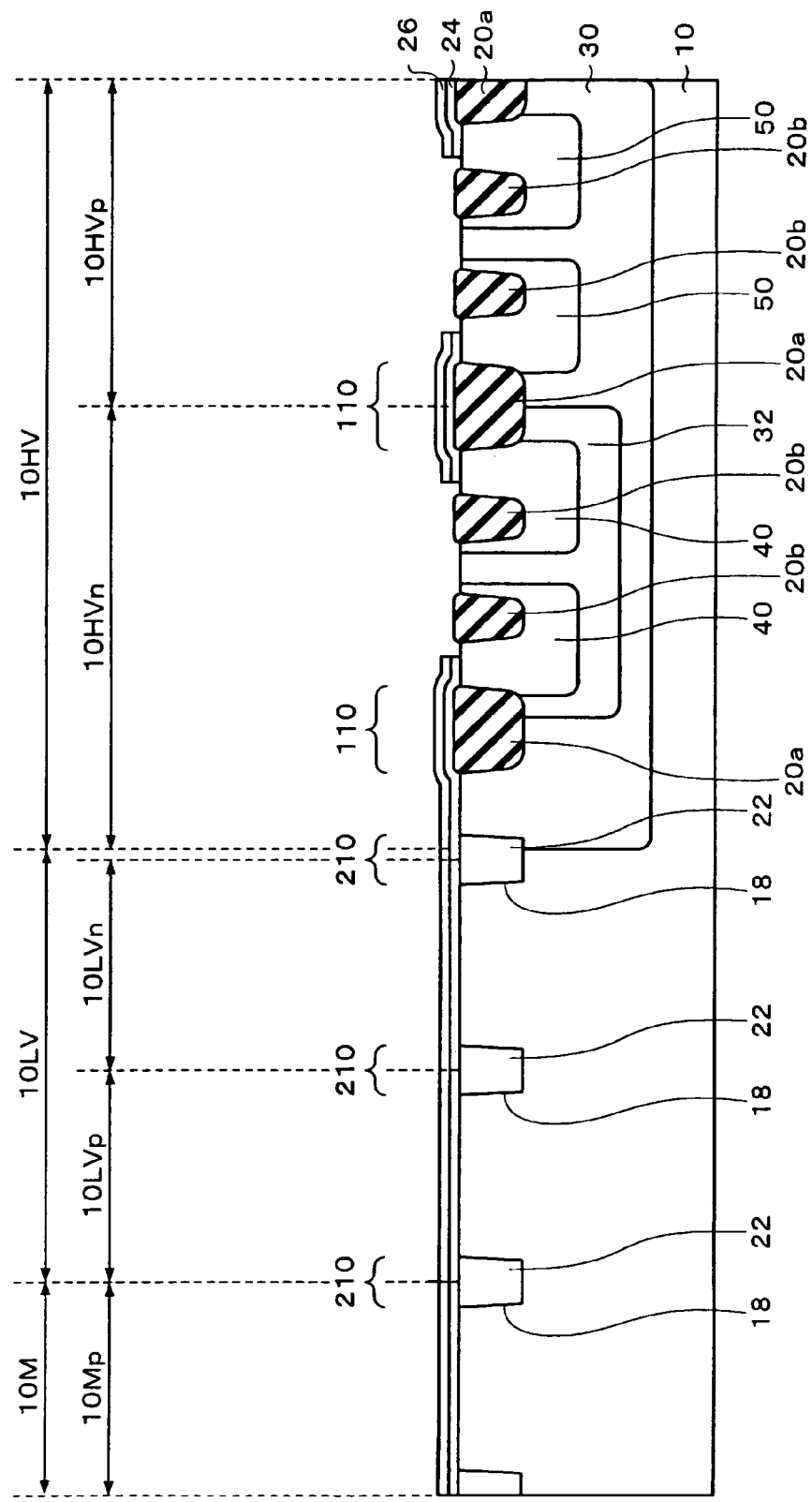
FIG. 11 is a sectional view of a fabrication method of a semiconductor device according to the present embodiment.
Figure 12:
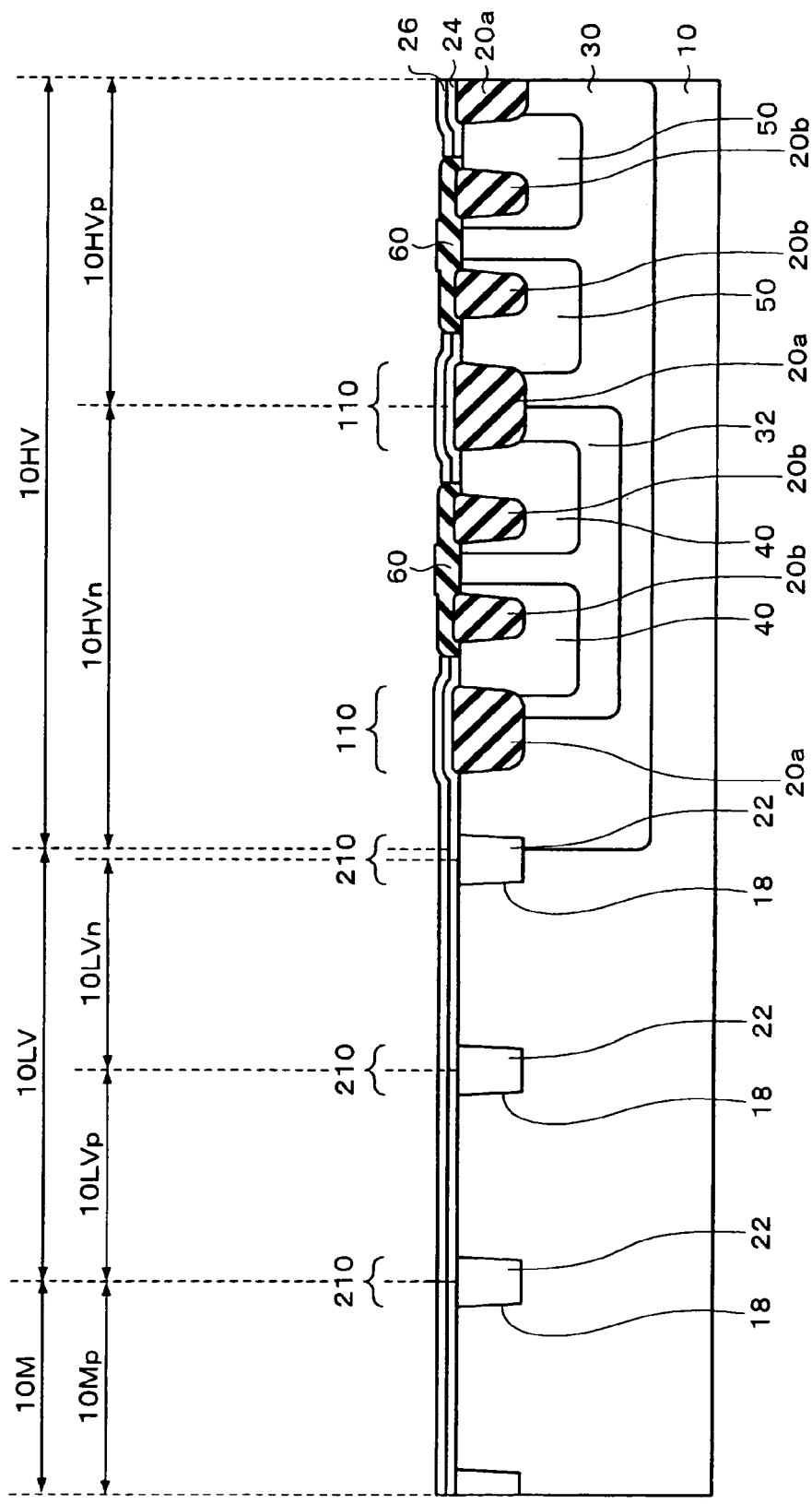
FIG. 12 is a sectional view of a fabrication method of a semiconductor device according to the present embodiment.

(10) Next, on the high voltage transistor forming area 10HV, there is formed a photoresist layer (not shown) as if layering over areas except an area (refer to FIG. 1) forming the first gate insulating layer 60 of the n-type high voltage transistor 100N and the first gate insulating layer 60 of the p-type high voltage transistor 100P. With the photoresist layer as a mask, as shown in FIG. 11, the exposed second mask layer 26 and the first mask layer 24 are removed. Removal of the second mask 26 may be, for example, performed by wet etching of phosphor. Removal of the first mask 24 may be, for example, performed by wet etching of hydrofluoric acid. After that, it is possible to perform channel doping as necessary on the high voltage transistor forming area 10HV.

(11) Next, on the high voltage transistor forming area 100, there is formed the first gate insulating layer 60. The first gate insulating layer 60 may be formed by the selective thermal oxidation process. The first mask layer 24 and the second mask layer 26 may be used as a mask for selective thermal oxidation. Film thickness of the first gate insulating layer 60 is, for example, 50 to 200 nm. Then, the second mask layer 26 is removed. If silicon nitride is, for example, used for the second mask layer 26, removal of the second mask 26 may be performed, for example, by wet etching of phosphor.

Figure 13:
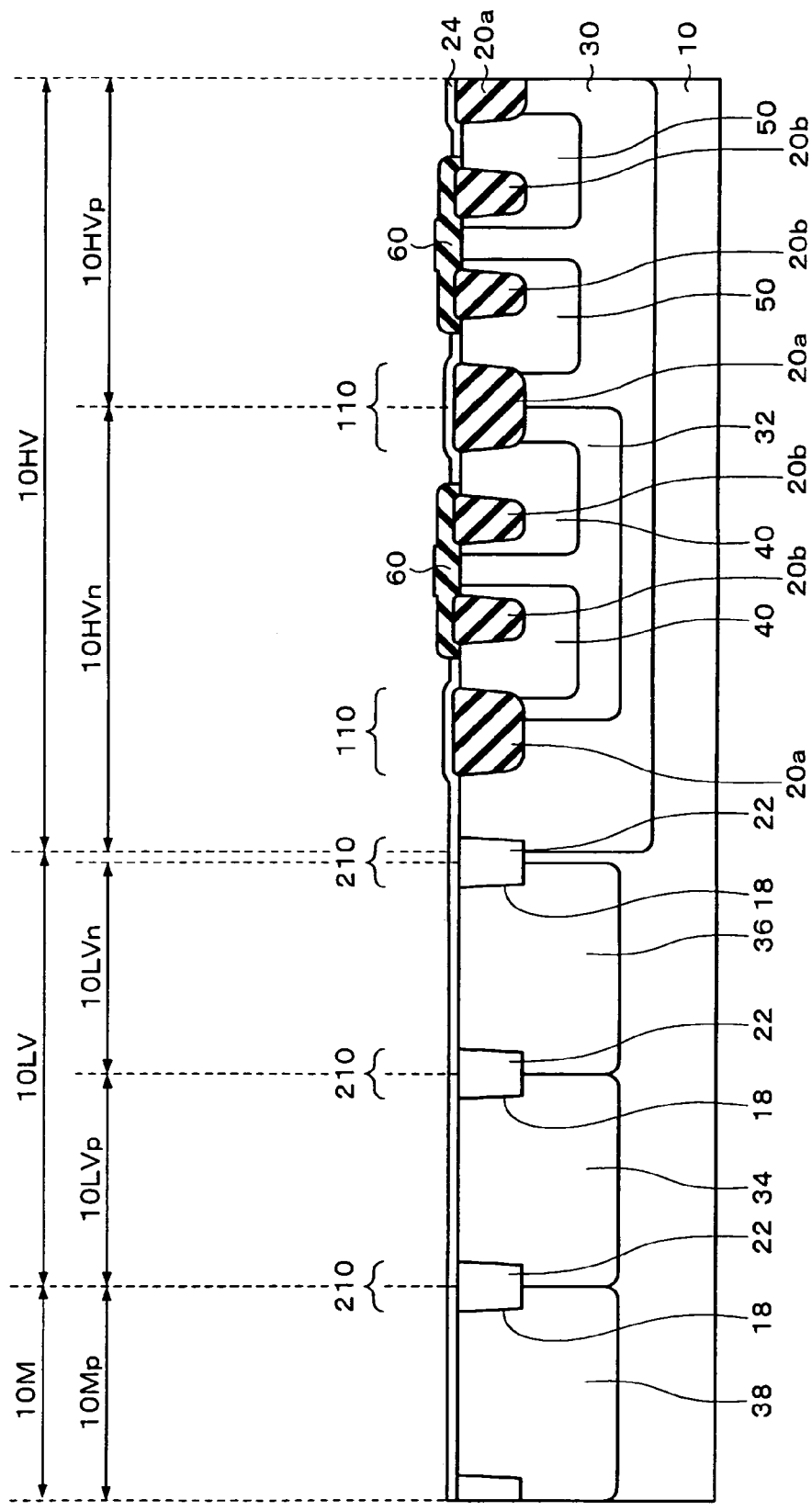
FIG. 13 is a sectional view of a fabrication method of a semiconductor device according to the present embodiment.

(12) Next, as shown in FIG. 13, a well is formed on the low voltage drive transistor area 10LV and the MNOS forming area 10M. Formation of the well is, for example, performed by the following method.

First, a photoresist layer (not shown) is formed as if layering over except the p-type low voltage drive transistor forming area 10LVp and the p-type MONOS memory transistor forming area 10Mp. Then, using the photoresist layer as a mask, through the first mask 24, ion implantation of n-type impurities such as phosphor and arsenic is carried out one time or a plurality of times, whereby the n-type second well 34 is formed on the p-type low voltage drive transistor forming area 10LVp and the n-type third well 38 is formed on the p-type MONOS forming area 10Mp. Then, the photoresist layer is removed.

Next, a photoresist layer is formed as if layering over areas except the n-type low voltage drive transistor forming area 10LVn. Then, using the photoresist layer as a mask, through the first mask 24, ion implantation of p-type impurities such as boron is carried out one time or a plurality of times, whereby the p-type second well 36 is formed. Subsequently, the photoresist layer is removed. Then, channel doping may be performed, as necessary, on the low voltage drive transistor forming area 10LV and the MONOS forming area 10M.

Figure 14:
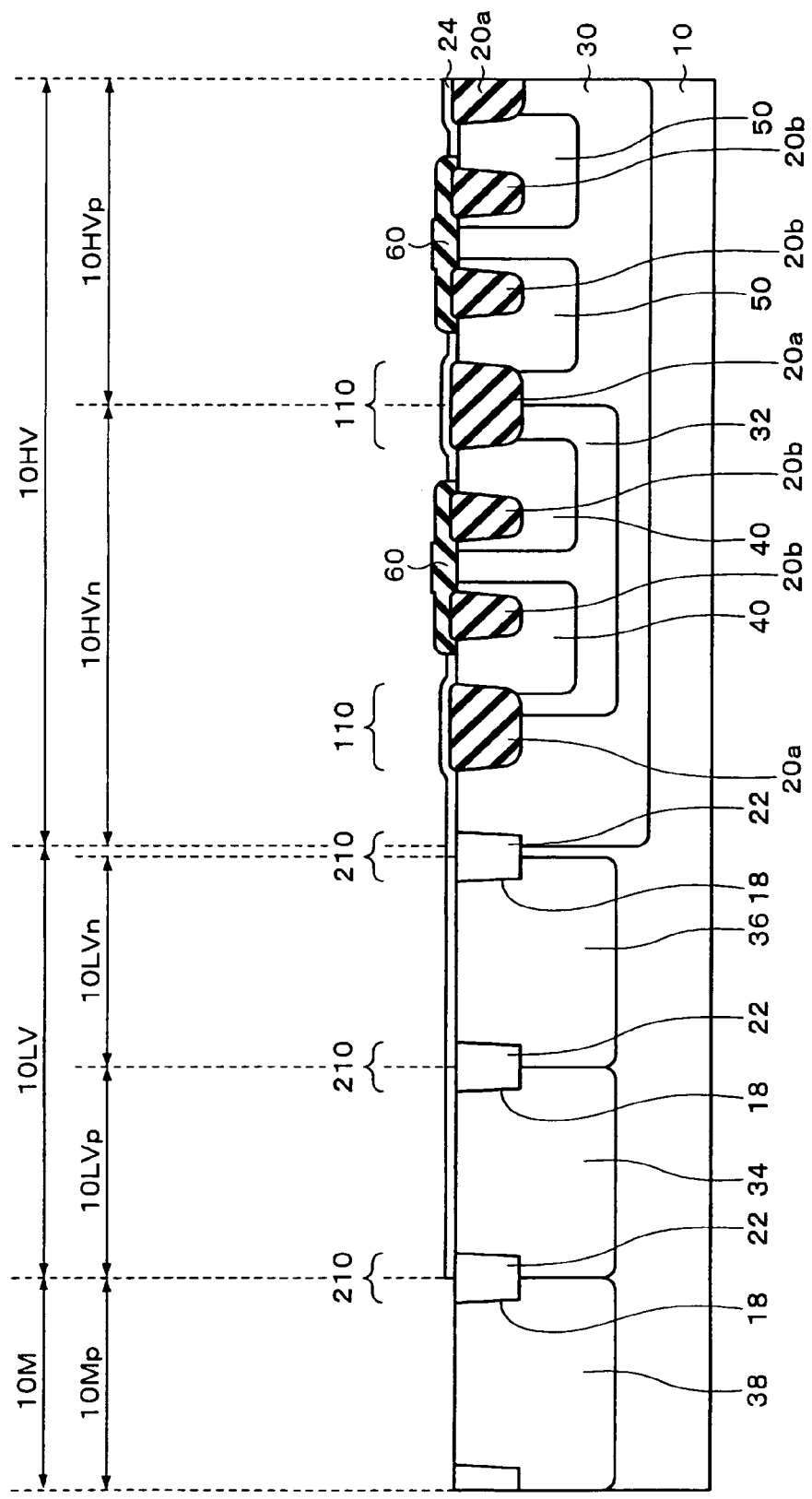
FIG. 14 is a sectional view of a fabrication method of a semiconductor device according to the present embodiment.

(13) Next, as shown in FIG. 14, the first mask layer 24 of the MONOS forming area 10M is removed. Removal of the first mask layer 24 may be performed, for example, by wet etching of hydrofluoric acid.

Figure 15:
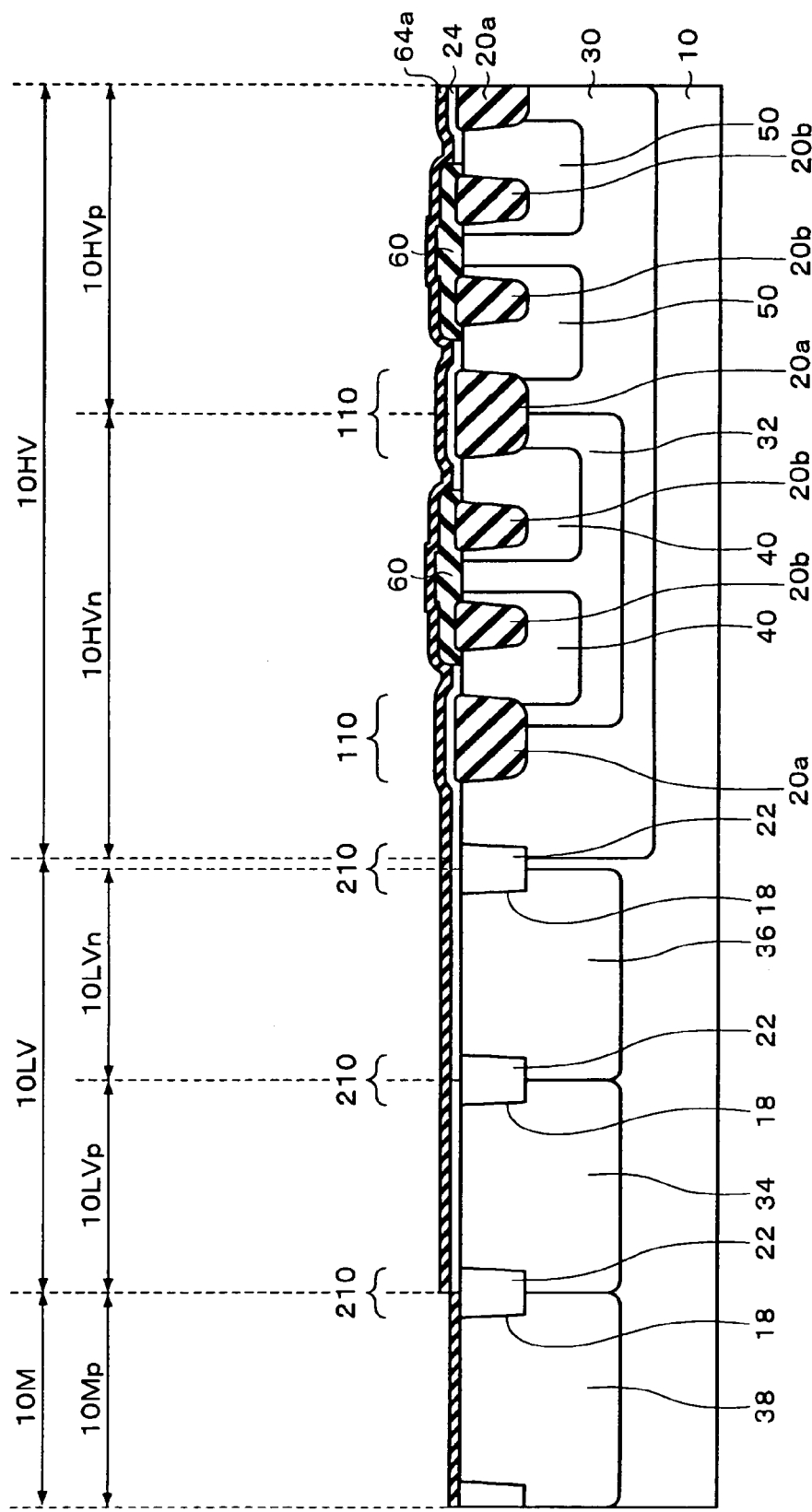
FIG. 15 is a sectional view of a fabrication method of a semiconductor device according to the present embodiment.

(14) Then, as shown in FIG. 15, the multi-layered film 64a, wherein the first silicon oxide layer, the silicon nitride layer, and the second silicon oxide layer are stacked, is formed over the entire surface of the high voltage transistor forming area 10HV, the low voltage drive transistor forming area 10LV, and the MONOS forming area 10M. The first silicon oxide layer may be formed, for example, by the thermal oxidation process. The silicon nitride layer and the second silicon oxide layer may be formed, for example, by the CVD method.

Figure 16:
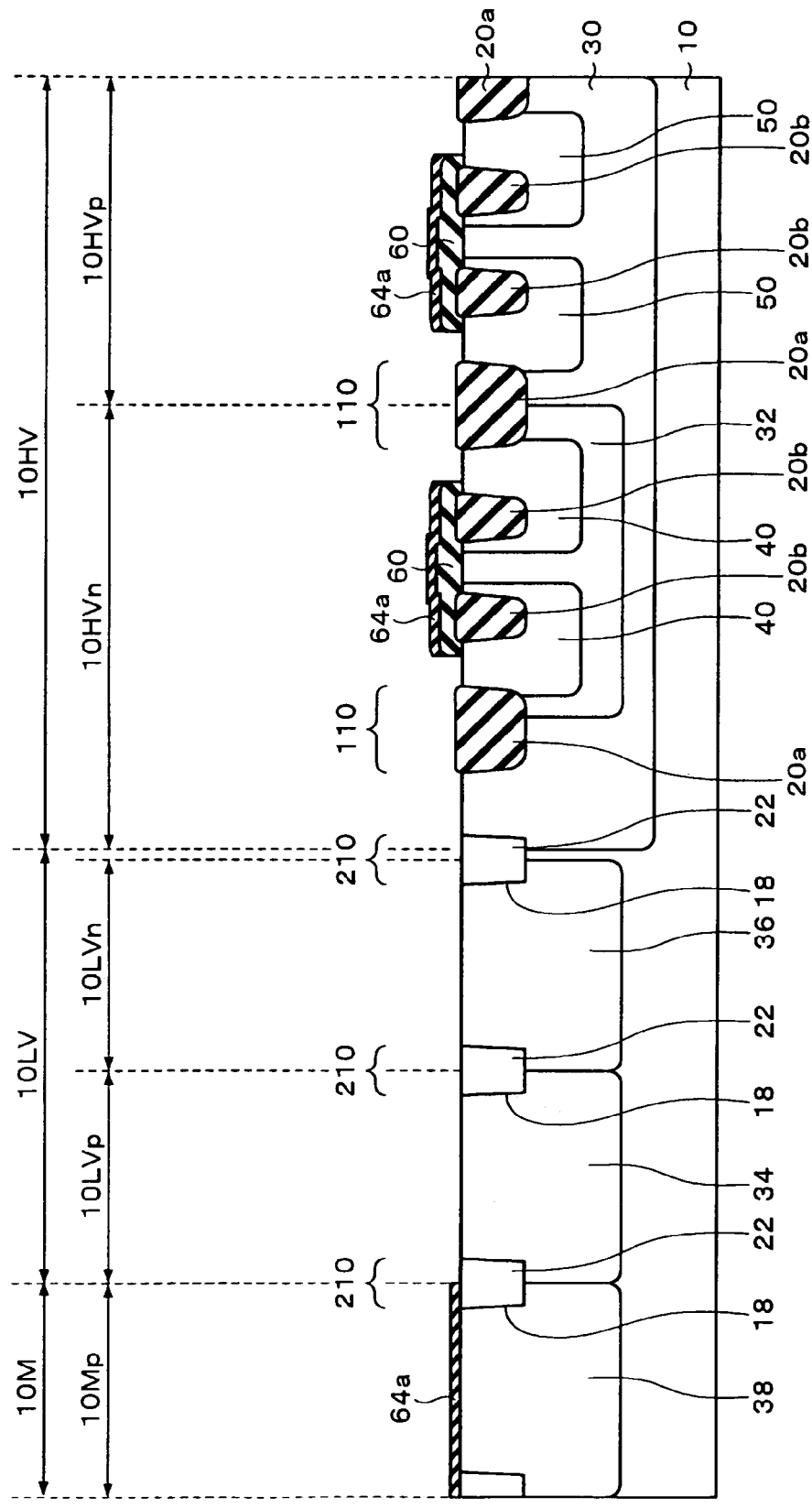
FIG. 16 is a sectional view of a fabrication method of a semiconductor device according to the present embodiment.

(15) Then, as shown in FIG. 16, on the high voltage transistor forming area 10HV, there is formed a photoresist layer (not shown) as if covering the first gate insulating layer 60 of the n-type high voltage transistor 100N, the first gate insulating layer 60 of the p-type high voltage transistor 100P, and the MONOS forming area 10M, and the exposed multi-layered film 64a and the first mask layer 24 are removed. So as not to remove the multi-layered film 64 formed on the first gate insulating layer 60 of the n-type high voltage transistor 100N and the first gate insulating layer 60 of the p-type high voltage transistor 100P, it is possible to prevent the first gate insulating layer 60 of the n-type high voltage transistor 100N and the first gate insulating layer 60 of the p-type high voltage transistor 100P from incurring damage when removing the multi-layered film 64a. Removal of the multi-layered film 64a may be performed, for example, by wet etching, dry etching or a combination of wet etching and dry etching and the like. Thereafter, the photoresist layer is removed by ashing.

Figure 17:
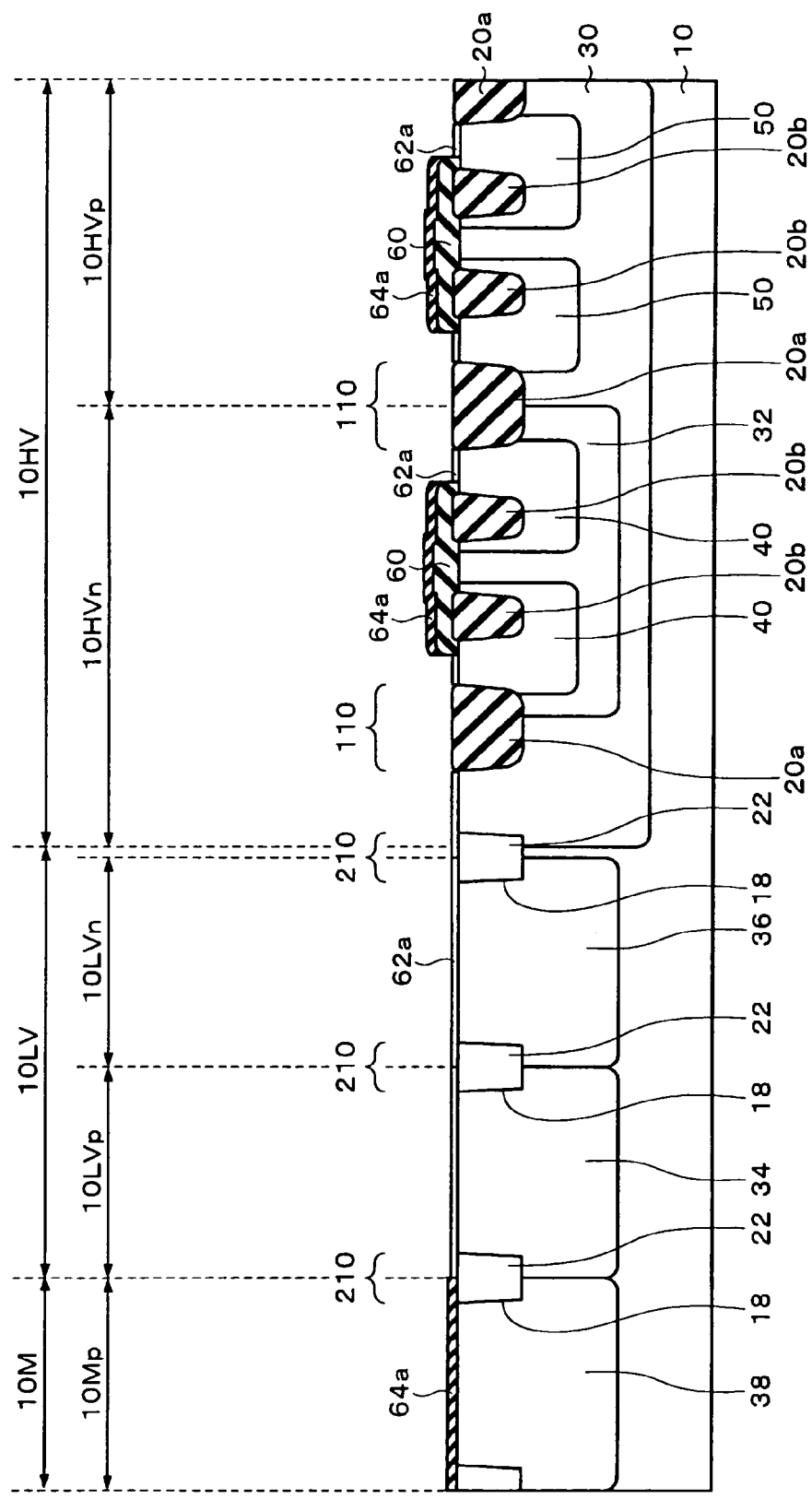
FIG. 17 is a sectional view of a fabrication method of a semiconductor device according to the present embodiment.

(16) Next, as shown in FIG. 17, an insulating layer 62a is formed. The Insulating layer 62a will become a gate insulating layer 62 of the n-type low voltage drive transistor 200N and a gate insulating layer 62 (refer to FIG. 1) of the p-type low voltage drive transistor 200P. The insulating layer 62a is, for example, formed by the thermal oxidation process. Film thickness of the insulating layer 62a is, for example, 1.6 to 15 nm.

Figure 18:
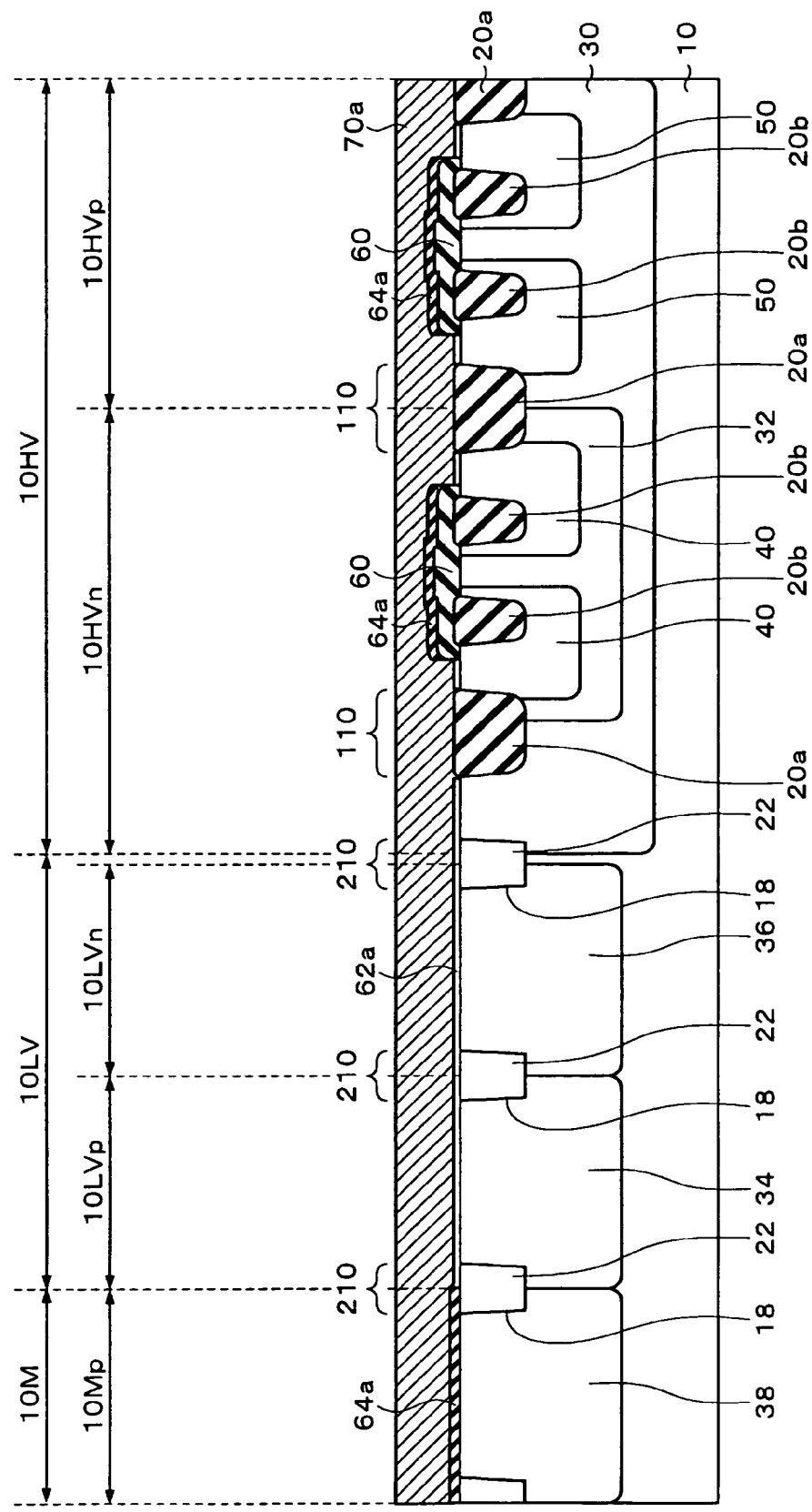
FIG. 18 is a sectional view of a fabrication method of a semiconductor device according to the present embodiment.

(17) Next, as shown in FIG. 18, a conductive layer 70a is formed over the entire surface of the high voltage transistor forming area 10HV, the low voltage drive transistor forming area 10LV, and the MONOS forming area 10M. As the conductive layer 70a, for example, a polysilicon layer maybe used. When using polysilicon as the material of the conductive layer 70a, ion implantation of impurities is carried out into the conductive layer 70a to provide the conductive layer 70a with low resistance.

Figure 19:
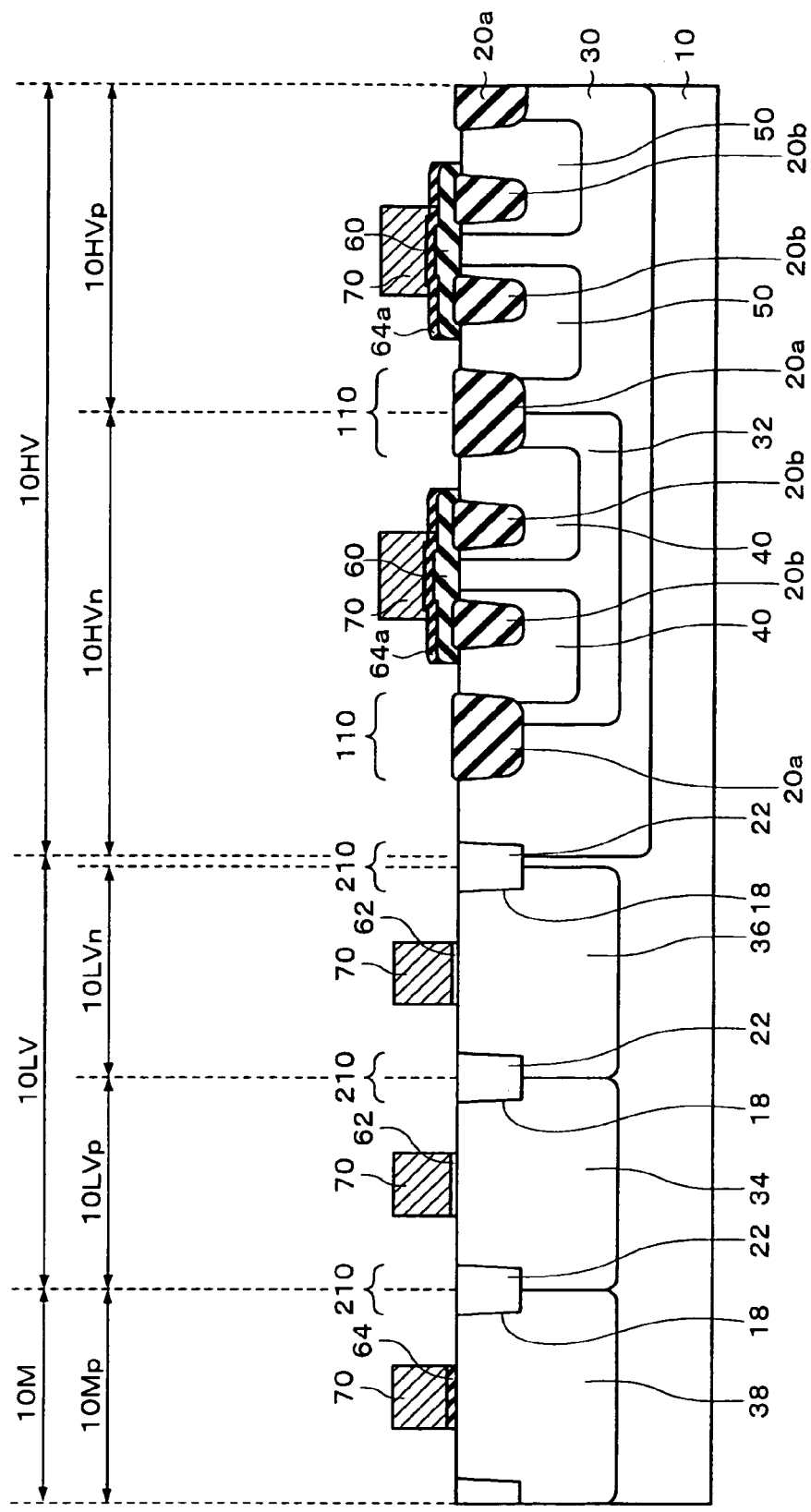
FIG. 19 is a sectional view of a fabrication method of a semiconductor device according to the present embodiment.

(18) Next, as shown in FIG. 19, a gate electrode 70 of each transistor is formed. Further, there are formed a gate insulating layer 62 of the n-type low voltage drive transistor 200N, a gate insulating layer 60 of the p-type low voltage drive transistor 200P, and a gate insulating layer 64 of the p-type MONOS memory transistor 300P. Specifically, a photoresist layer (not shown) having a prescribed pattern is first formed. Then, by patterning the conductive layer 70a, the insulating layer 62a, and the multi-layered film 64a (refer to FIG. 17) with the photoresist layer as a mask, there are formed the gate electrode 70 of each transistor, the gate insulating layer 62 of the n-type low voltage drive transistor 200N, the gate insulating layer 62 of the p-type low voltage drive transistor 200P, and the gate insulating layer 64 of the p-type MONOS memory transistor 300P.

Figure 20:
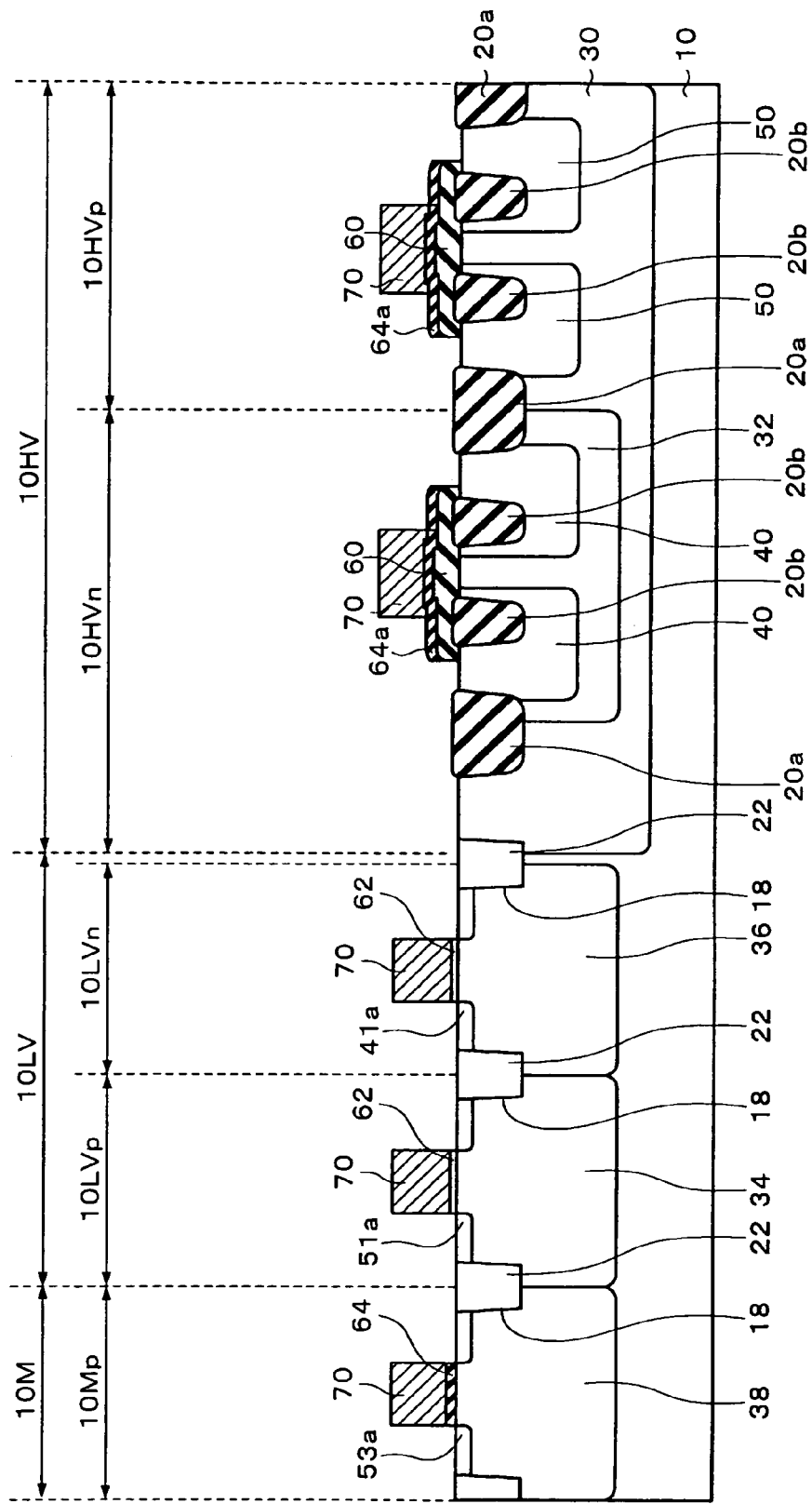
FIG. 20 is a sectional view of a fabrication method of a semiconductor device according to the present embodiment.

(19) Next, as shown in FIG. 20, an impurities layer 41a which will become an n-type extension area is formed on the n-type low voltage drive transistor forming area 10LVp. An impurities layer 51a which will become a p-type extension area is formed on the p-type low voltage drive transistor forming area 10LVp. An impurities layer 53a which will become a p-type extension area is formed on the p-type MONOS forming area 10Mp. Impurities layers 41a, 51a, and 53a form mask layers by means of typical lithography techniques and may be formed by implantation of prescribed impurities.

Figure 21:
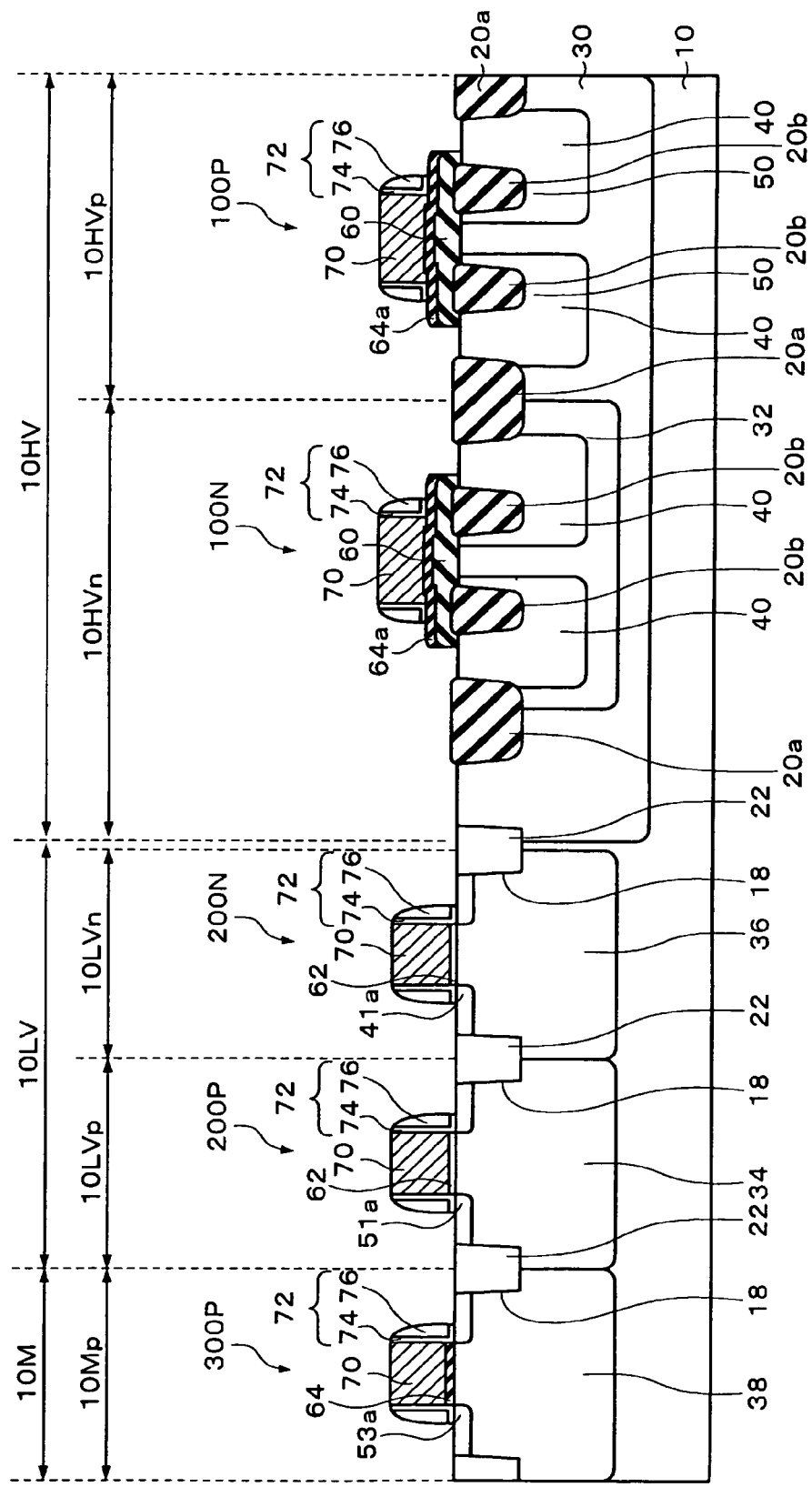
FIG. 21 is a sectional view of a fabrication method of a semiconductor device according to the present embodiment.

(20) Next, an insulating layer (not shown in FIG. 21) is formed over the entire surface. By subjecting this insulating layer to anisotropic etching, a sidewall insulating layer 72 is formed on the sidewall of the gate electrode 70. In an illustrated example, the insulating layer is a multi-layered film wherein, for example, the silicon oxide layer 74 and the silicon nitride layer 76 formed thereon are stacked. In this case, as shown in FIG. 21, the silicon oxide layer 74 is formed in an L sectional shape on the upper surface of the semiconductor layer 10 and on the sidewall of each gate electrode 70. Film thickness of the silicon oxide layer 74 is, for example, approximately 10 nm, while film thickness of the silicon nitride layer 76 is, for example, approximately 70 nm.

(21) Next, as shown in FIG. 1, the n-type source/drain area 42 is formed in the semiconductor layer 10 on the outside of the sidewall insulating layer 72 by introducing n-type impurities into a prescribed area of the semiconductor layer 10 on the n-type high voltage transistor forming area 10HVn and the n-type low voltage drive transistor forming area 10LVn. Formation of the n-type source/drain area 42 may be performed by a publicly known method.

Next, the p-type source/drain area 52 is formed in the semiconductor layer 10 on the outside of the sidewall insulating layer 72 by introducing p-type impurities into a prescribed area of the semiconductor layer 10 on the p-type high voltage transistor forming area 10HVp and the p-type low voltage drive transistor forming area 10LVp. Formation of the p-type source/drain area 52 may be performed by a publicly known method.

It is possible to fabricate a semiconductor device according to the present embodiment by using the aforementioned processes. The fabrication method of the semiconductor device has the following characteristics.

According to the fabrication method of the semiconductor device of the present embodiment, as compared to a low voltage drive transistor, it is possible to mount a high voltage transistor required for a high temperature process to form a deep well and a thick gate insulating layer and a MONOS memory transistor required for a unique multi-layered film formation process.

Further, according to the fabrication method of a semiconductor device of the present embodiment, the first mask layer 24 may be used as a mask for selective thermal oxidation in the step (11) of forming, through the selective thermal oxidation process, the first gate insulating layer 60 of the n-type and p-type high voltage transistors 100N and 100P, and, in a case where a well is formed by ion implantation in the step (12) of forming the well on the low voltage drive transistor forming area 10LV and the MONOS memory transistor forming area 10M, it functions as a protective film at the time of ion implantation. Namely, in the two steps, the first mask layer 24 may serve dual purposes, thus resulting in simplifying the fabrication process.

It should be noted that the present invention is not limited to the above-mentioned embodiments but may be changed within a range of the spirit of the present invention. For example, in the present embodiment, the MONOS memory transistor has been described, whereas the same fabrication method may be used to form a MNOS memory transistor, Namely, the multi-layered film 64*a* may serve at least as the two-layer multi-layered film of the silicon oxide layer and the silicon nitride layer.

Further, for example, in the present embodiment, as a method of forming the offset insulating layer 20*b*, a case of using the semi-recessed LOCOS method was described, while it is possible to carry it out by using the LOCOS method or the recessed LOCOS method.

Still further, for example, in the present embodiment, an example of forming a well on the low voltage drive transistor forming area 10LV and the MONOS memory transistor forming area 10M upon forming the trench insulating layer 22 has been described, while it is possible to form a well on the low voltage drive transistor forming area 10LV and the MONOS memory transistor forming area 10M prior to forming the trench insulating layer 22, that is, prior to the above-mentioned step (7).

What is claimed is:

1. A method of manufacturing a semiconductor device having a high voltage transistor, a low-voltage drive transistor, and an MNOS memory transistor, comprising:

forming a first mask layer above a high voltage transistor forming area wherein the high voltage transistor of a semiconductor layer is formed, a low voltage drive transistor area wherein the low voltage drive transistor is formed, and an MNOS memory transistor forming area wherein the MNOS memory transistor is formed, each forming area being of a semiconductor layer;

forming a second mask layer above the first mask layer;

removing the first mask layer and the second mask layer formed on a first gate insulating layer forming area of the high voltage transistor;

forming a first gate insulating layer by a thermal oxidation process on the high voltage transistor forming area using the first mask layer and the second mask layer as a mask;

removing the second mask layer formed on the high voltage transistor forming area, the low voltage drive transistor forming area, and the MNOS memory transistor forming area;

removing the first mask layer formed on the MNOS memory transistor forming area;

forming a multi-layered film, wherein at least a silicon oxide layer and a silicon nitride film are stacked, above the high voltage transistor forming area wherein the high voltage transistor of a semiconductor layer is formed, the low voltage drive transistor area wherein the low voltage drive transistor is formed, and the MNOS memory transistor forming area wherein the MNOS memory transistor is formed, each forming area being of the semiconductor layer;

removing the multi-layered film formed on the low voltage drive transistor forming area;

removing the first mask layer formed on the low voltage drive transistor forming area;

forming a second gate insulating layer on the low voltage drive transistor forming area;

forming a gate electrode on the high voltage transistor forming area, the low voltage drive transistor forming area, and the MNOS memory transistor forming area; and forming a source/drain area on the high voltage transistor forming area, the low voltage drive transistor forming area, and the MNOS memory transistor forming area.

2. The fabrication method of the semiconductor device according to claim 1, wherein the step of removing the multi-layered film formed on the low voltage drive transistor forming area further comprises not removing multi-layered film formed above at least a channel region of the high voltage transistor.

3. The fabrication method of the semiconductor device according to claim 1 or 2, further comprising:

forming the multi-layered film such that the first silicon oxide layer, the silicon nitride layer, and the second silicon oxide layer are layered over one another.

4. The fabrication method of the semiconductor device according to claim 1 or claim 2, further comprising:

forming a well in the low voltage drive transistor forming area and the MNOS memory transistor forming area by ion implantation, the ion implantation being conducted through the first mask layer.

5. The fabrication method of the semiconductor device according to claim 1 or claim 2, further comprising:

forming an element isolation area in the high voltage transistor forming area by a LOCOS method; and forming an element isolation area on the low voltage drive transistor forming area and the MNOS memory transistor forming area by a trench element isolation process.

6. The method of manufacturing the semiconductor device according to claim 5, wherein the well in the low voltage drive transistor forming area and the MNOS memory transistor forming area are formed prior to the step of forming the element isolation area on the low voltage drive transistor forming area and the MNOS memory transistor forming area.

7. The method of manufacturing the semiconductor device according to claim 5, wherein the well in the low voltage drive transistor forming area and the MNOS memory transistor forming area are formed subsequent to the step of forming the element isolation area on the low voltage drive transistor forming area and the MNOS memory transistor forming area.

8. The fabrication method of the semiconductor device according to any of claims 1, 2, 6 or 7, wherein the high voltage transistor being formed such as to have an offset insulating layer.

9. The fabrication method of the semiconductor device according to claim 8, wherein the offset insulating layer is formed by the LOCOS method.

10. The fabrication method of the semiconductor device according to claim 3, further comprising:

forming a well in the low voltage drive transistor forming area and the MNOS memory transistor forming area by ion implantation, the ion implantation being conducted through the first mask layer.

11. The fabrication method of the semiconductor device according to claim 3, further comprising:

forming an element isolation area in the high voltage transistor forming area by the LOCOS method; and forming an element isolation area on the low voltage drive transistor forming area and the MNOS memory transistor forming area by a trench element isolation process.

12. The fabrication method of the semiconductor device according to claim 4, further comprising:

forming an element isolation area in the high voltage transistor forming area by the LOCOS method; and forming an element isolation area on the low voltage drive transistor forming area and the MNOS memory transistor forming area by a trench element isolation process.

* * * * *